United States Patent
Ishii et al.

(10) Patent No.: US 12,218,185 B2
(45) Date of Patent: Feb. 4, 2025

(54) THIN FILM CAPACITOR AND ELECTRONIC CIRCUIT SUBSTRATE HAVING THE SAME

(71) Applicant: TDK Corporation, Tokyo (JP)

(72) Inventors: Daiki Ishii, Tokyo (JP); Yoshihiko Yano, Tokyo (JP); Yuki Yamashita, Tokyo (JP); Kenichi Yoshida, Tokyo (JP); Tetsuhiro Takahashi, Tokyo (JP)

(73) Assignee: TDK Corporation, Tokyo (JP)

( * ) Notice: Subject to any disclaimer, the term of this patent is extended or adjusted under 35 U.S.C. 154(b) by 121 days.

(21) Appl. No.: 18/012,145

(22) PCT Filed: Dec. 24, 2020

(86) PCT No.: PCT/JP2020/048391
§ 371 (c)(1),
(2) Date: Dec. 21, 2022

(87) PCT Pub. No.: WO2022/004015
PCT Pub. Date: Jan. 6, 2022

(65) Prior Publication Data
US 2023/0268125 A1      Aug. 24, 2023

Related U.S. Application Data

(60) Provisional application No. 63/045,579, filed on Jun. 29, 2020.

(51) Int. Cl.
*H01G 4/008* (2006.01)
*H01G 2/06* (2006.01)
(Continued)

(52) U.S. Cl.
CPC ............. *H01L 28/75* (2013.01); *H01G 2/065* (2013.01); *H01G 4/005* (2013.01); *H01G 4/008* (2013.01);
(Continued)

(58) Field of Classification Search
CPC ............. H01G 4/005; H01G 4/06; H01G 4/33; H05K 1/18; H05K 2201/10015
See application file for complete search history.

(56) References Cited

U.S. PATENT DOCUMENTS

| 2003/0116348 A1 | 6/2003 | Nakatani et al. |
| 2008/0068780 A1 | 3/2008 | Shioga et al. |

(Continued)

FOREIGN PATENT DOCUMENTS

| JP | 58-153321 A | 9/1983 |
| JP | 2001-203455 A | 7/2001 |

(Continued)

OTHER PUBLICATIONS

International Search Report issued in corresponding International Patent Application No. PCT/JP2020/048391, dated Mar. 30, 2021, with English translation.

*Primary Examiner* — Nathan Milakovich
(74) *Attorney, Agent, or Firm* — Rimon P.C.

(57) ABSTRACT

To provide a thin film capacitor in which warpage is less likely to occur. A thin film capacitor includes: a metal foil having roughened upper and lower surfaces; a dielectric film covering the upper surface of the metal foil and having an opening through which the metal foil is partly exposed; a dielectric film covering the lower surface of the metal foil and made of a dielectric material having a thermal expansion coefficient smaller than that of the metal foil; a first electrode layer contacting the metal foil through the opening; and a second electrode layer contacting the first dielectric film without contacting the metal foil. The lower surface of the metal foil is thus covered with the dielectric film having a small thermal expansion coefficient, thereby making it possible to prevent the occurrence of warpage.

16 Claims, 29 Drawing Sheets

(51) Int. Cl.
*H01G 4/005* (2006.01)
*H01G 4/01* (2006.01)
*H01G 4/012* (2006.01)
*H01G 4/06* (2006.01)
*H01G 4/10* (2006.01)
*H01G 4/12* (2006.01)
*H01G 4/228* (2006.01)
*H01G 4/252* (2006.01)
*H01G 4/33* (2006.01)
*H01L 23/00* (2006.01)
*H01L 25/16* (2023.01)
*H01L 49/02* (2006.01)
*H05K 1/18* (2006.01)

(52) U.S. Cl.
CPC ............... *H01G 4/01* (2013.01); *H01G 4/012* (2013.01); *H01G 4/06* (2013.01); *H01G 4/10* (2013.01); *H01G 4/1209* (2013.01); *H01G 4/1218* (2013.01); *H01G 4/1254* (2013.01); *H01G 4/228* (2013.01); *H01G 4/33* (2013.01); *H01L 25/16* (2013.01); *H01L 28/84* (2013.01); *H05K 1/18* (2013.01); *H01G 4/252* (2013.01); *H01L 24/16* (2013.01); *H01L 2224/16227* (2013.01); *H01L 2924/19015* (2013.01); *H01L 2924/19041* (2013.01); *H01L 2924/19102* (2013.01); *H01L 2924/19103* (2013.01); *H05K 2201/10015* (2013.01)

(56) References Cited

U.S. PATENT DOCUMENTS

| | | |
|---|---|---|
| 2008/0106845 A1 | 5/2008 | Kunimatsu et al. |
| 2009/0242256 A1 | 10/2009 | Saita et al. |
| 2016/0329158 A1 | 11/2016 | Hattori et al. |
| 2018/0151297 A1 | 5/2018 | Hattori et al. |
| 2018/0158609 A1 | 6/2018 | Aoki |
| 2018/0158611 A1 | 6/2018 | Arakawa et al. |
| 2019/0080849 A1* | 3/2019 | Fujii ................. H01G 4/236 |
| 2019/0267188 A1 | 8/2019 | Fujii et al. |
| 2020/0135406 A1* | 4/2020 | Aburakawa ............ H01G 4/012 |
| 2021/0257164 A1* | 8/2021 | Hiraoka ................. H05K 1/162 |
| 2021/0265116 A1* | 8/2021 | Aburakawa ....... H01L 23/49822 |
| 2023/0253161 A1* | 8/2023 | Ishii ........................ H01G 9/28 257/734 |
| 2023/0253446 A1* | 8/2023 | Yano ..................... H01G 4/012 361/303 |
| 2023/0260697 A1* | 8/2023 | Yamashita ............. H01G 9/055 257/773 |
| 2023/0260698 A1* | 8/2023 | Ishii ......................... H01G 9/07 257/773 |
| 2023/0260713 A1* | 8/2023 | Ishii ......................... H01G 4/33 361/311 |
| 2023/0268120 A1* | 8/2023 | Ishii ....................... H01L 28/60 361/782 |
| 2023/0268133 A1* | 8/2023 | Ishii ......................... H01G 9/15 361/311 |
| 2023/0335579 A1* | 10/2023 | Ishii ....................... H01G 9/055 |

FOREIGN PATENT DOCUMENTS

| | | |
|---|---|---|
| JP | 2007-149730 A | 6/2007 |
| JP | 2008-078299 A | 4/2008 |
| JP | 2009-246110 A | 10/2009 |
| WO | 2007/010768 A1 | 1/2007 |
| WO | 2015/118901 A1 | 8/2015 |
| WO | 2017/014020 A1 | 1/2017 |
| WO | 2017/026233 A1 | 2/2017 |
| WO | 2017/026247 A1 | 2/2017 |
| WO | 2018/092722 A1 | 8/2019 |

* cited by examiner

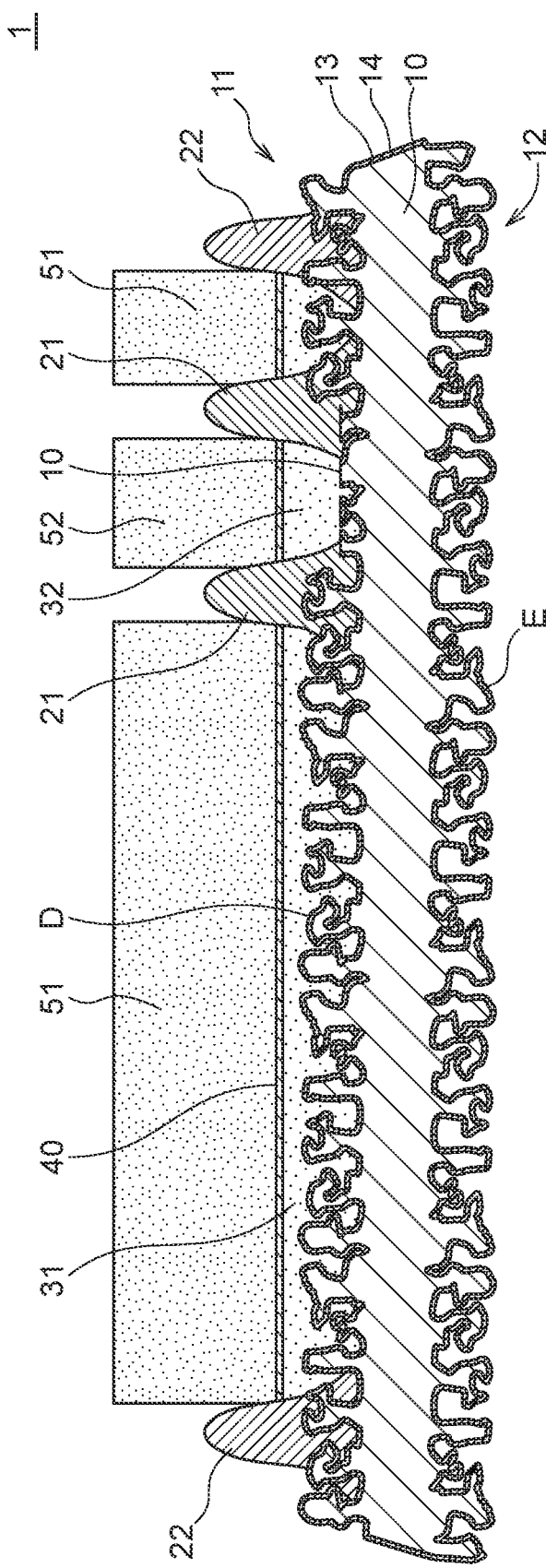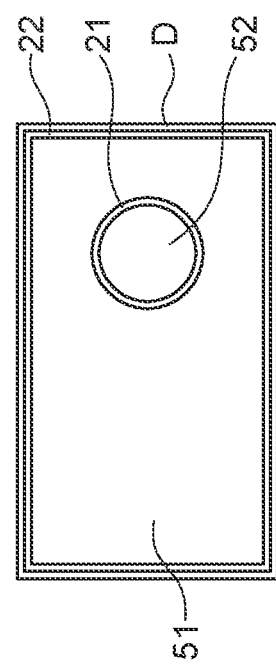
FIG.1A
FIG.1B

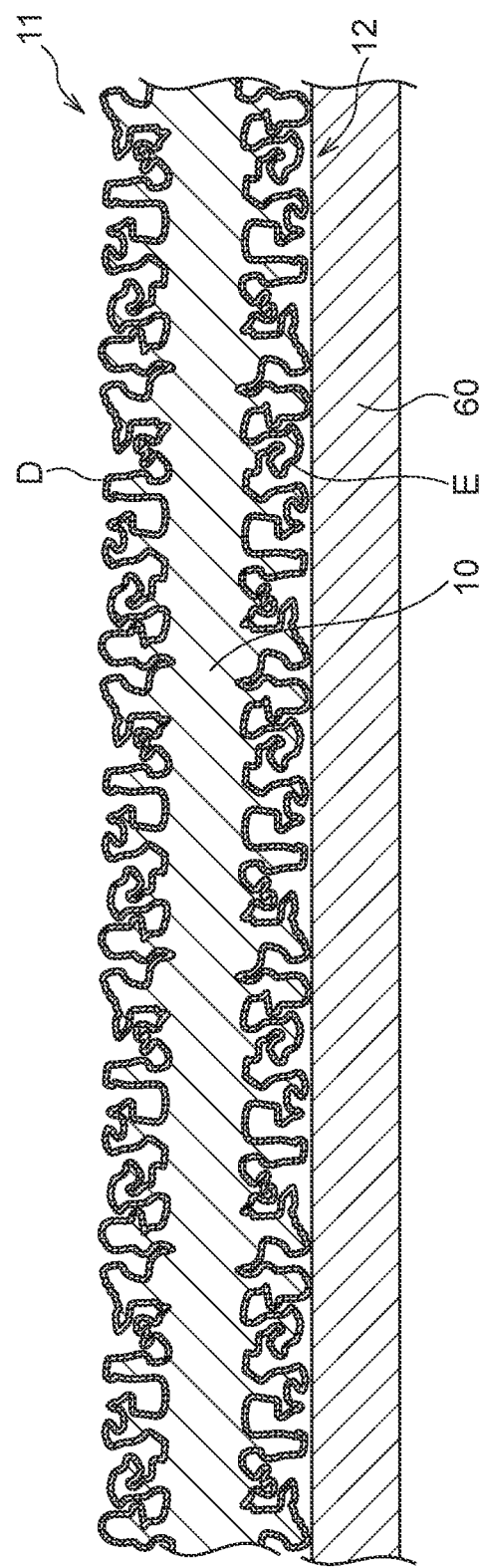

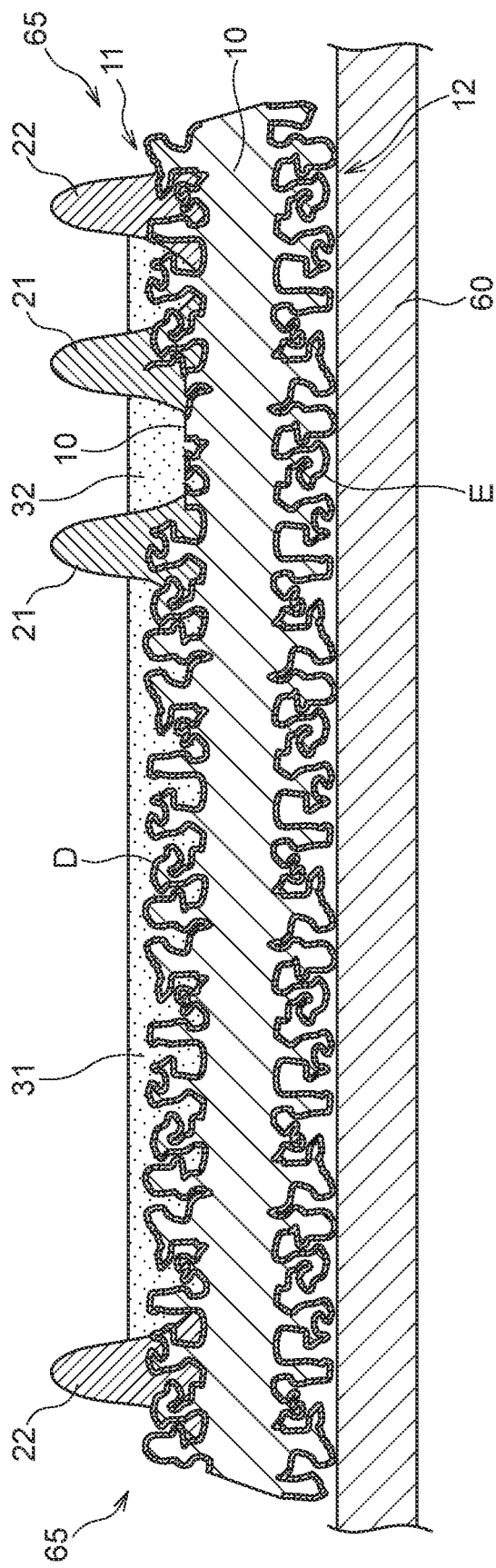
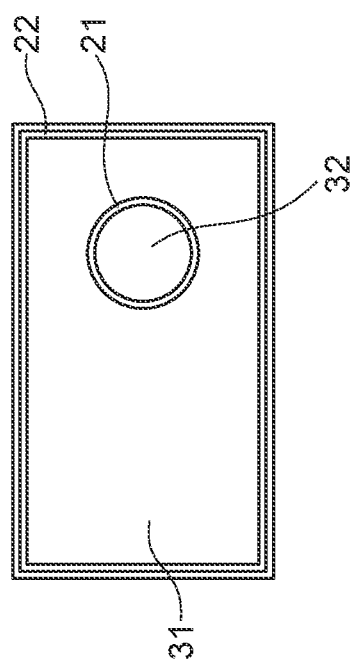
FIG.20A
FIG.20B

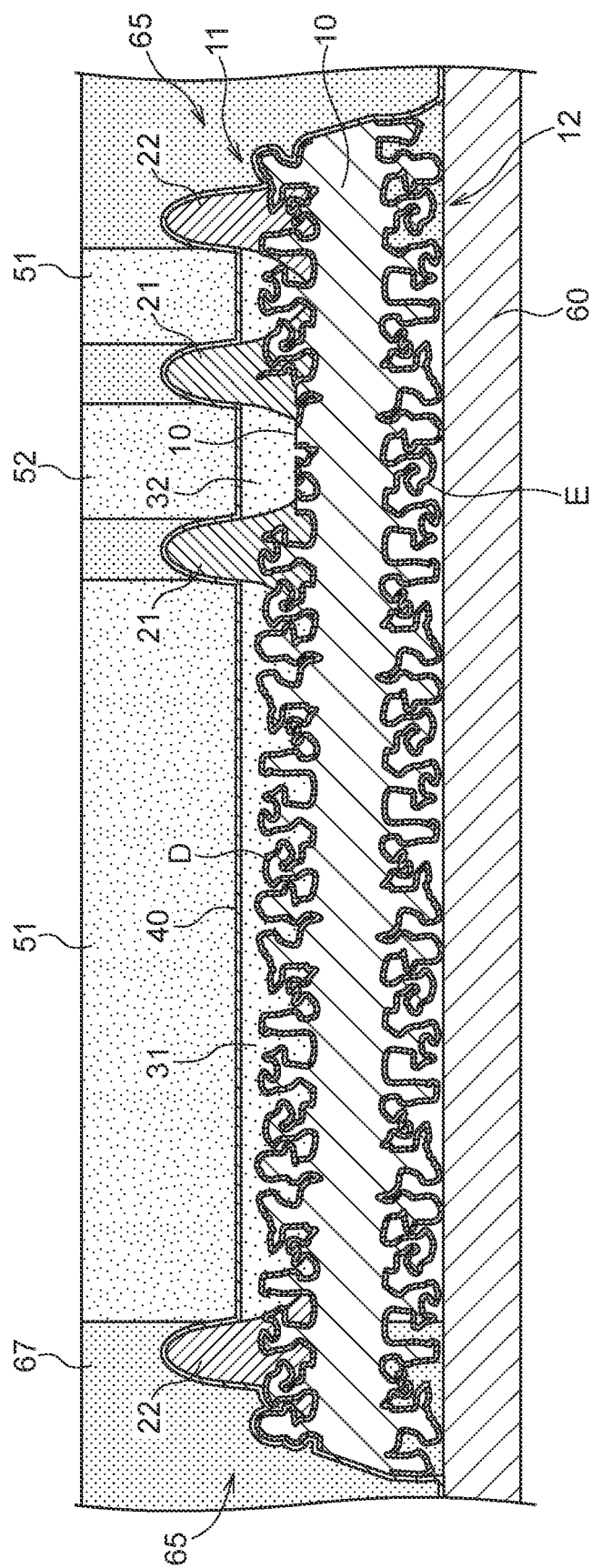
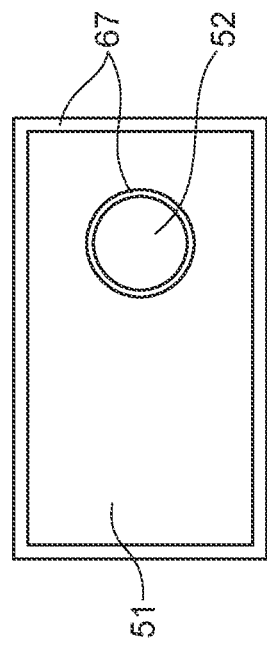
FIG.23A
FIG.23B

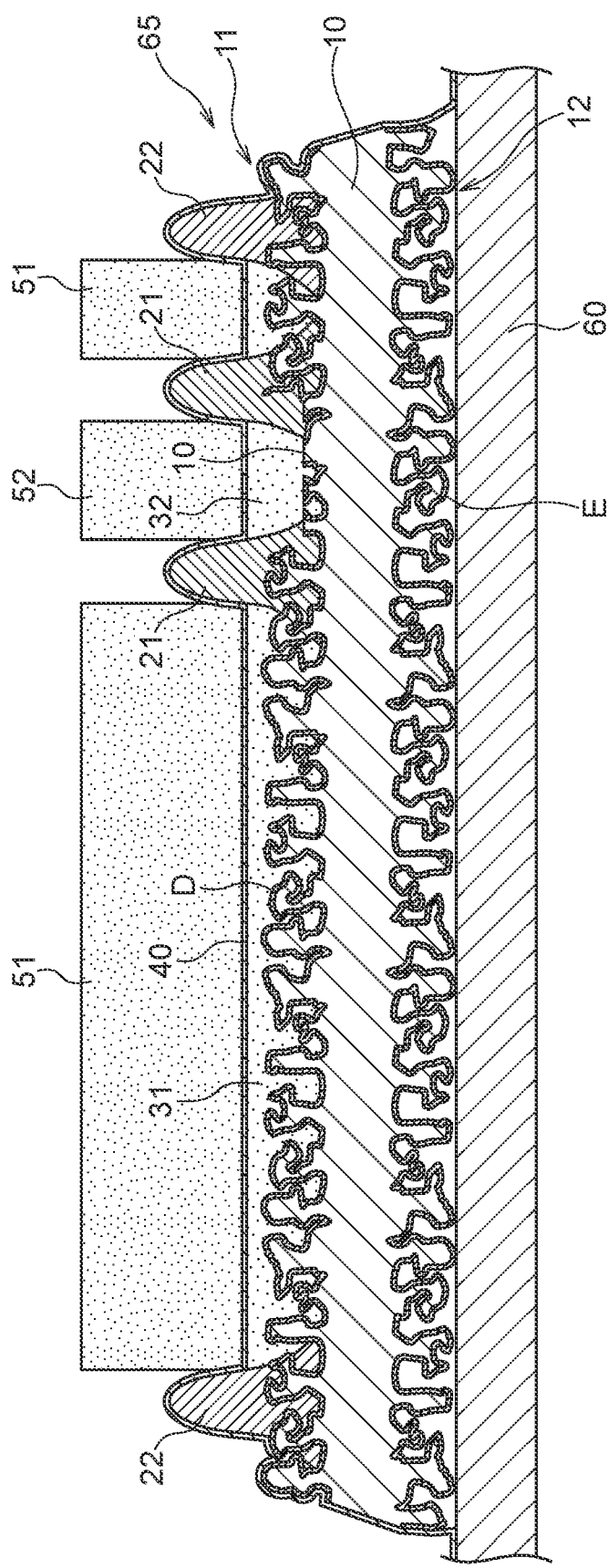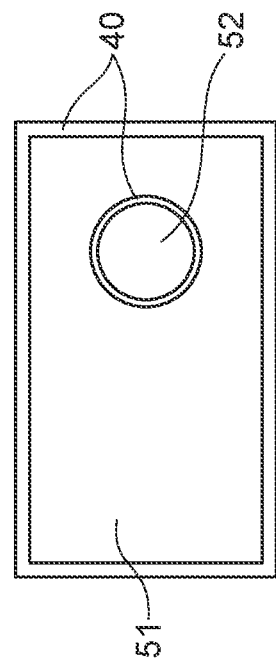
FIG.24A
FIG.24B

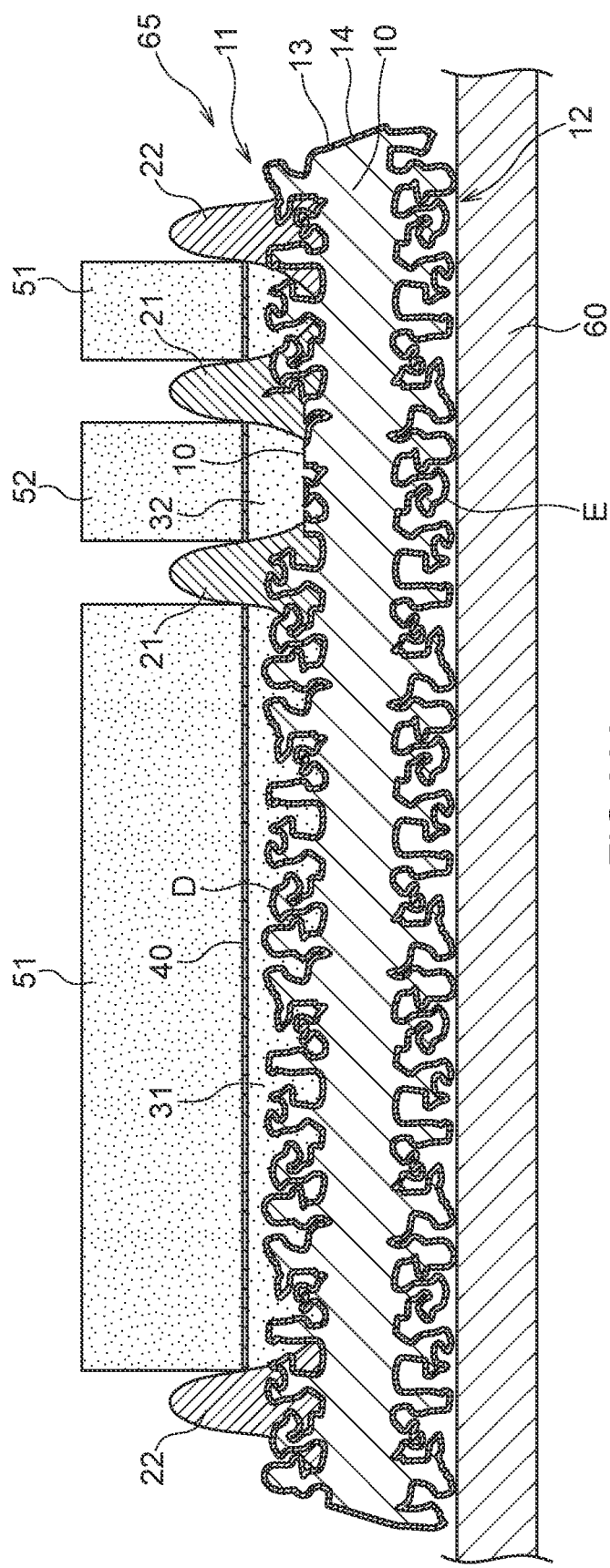
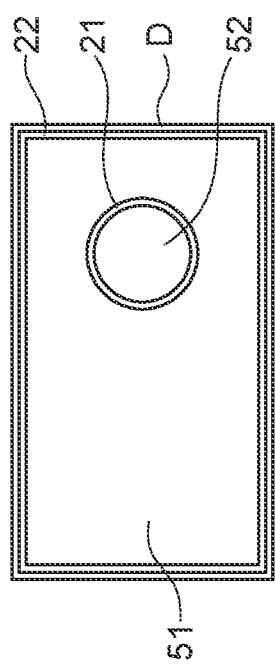
FIG.26A
FIG.26B

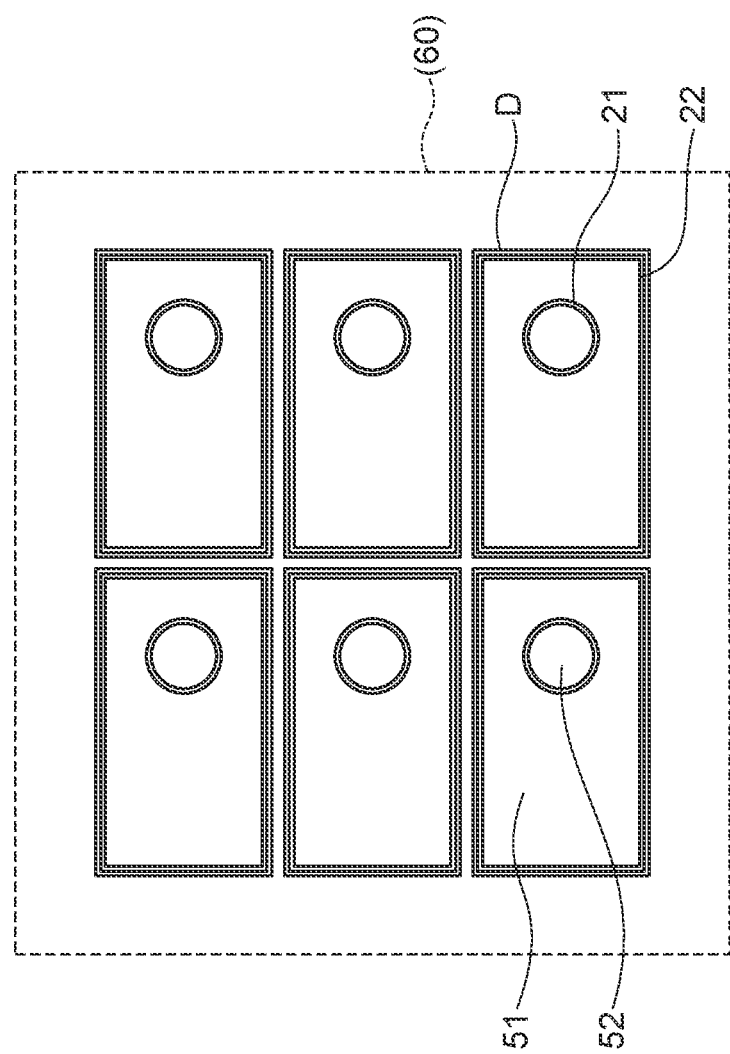

| Sample | Rq1 (nm) | Rq2 (nm) | Rq2/Rq1 | Film E | Thermal expansion coefficient (ppm/°C) | Material of film E | Thickness of film E | Amount of warpage ($\mu m$) | Implementation failure rate (%)n=100 |
|---|---|---|---|---|---|---|---|---|---|
| B1 | 112 | 52 | 0 | Absence | — | — | — | 375 | 42 |
| A1 | 114 | 45 | 0 | Presence | 13.5 | $BaTiO_2$ | 5nm | 245 | 32 |
| A2 | 122 | 60 | 0 | Presence | 9.1 | $ZrO_2$ | 4nm | 204 | 28 |
| A3 | 121 | 55 | 0 | Presence | 8.5 | $CaZrO_3$ | 4nm | 185 | 25 |
| A4 | 125 | 52 | 0 | Presence | 7.2 | $TiO_2$ | 5nm | 155 | 24 |
| A5 | 132 | 60 | 0 | Presence | 7.1 | $Al_2O_3$ | 5nm | 145 | 22 |
| A6 | 115 | 207 | 2 | Presence | 9.1 | $ZrO_2$ | 4nm | 110 | 18 |
| A7 | 110 | 225 | 2 | Presence | 7.1 | $Al_2O_3$ | 5nm | 105 | 17 |
| A8 | 118 | 356 | 3 | Presence | 9.1 | $ZrO_2$ | 4nm | 85 | 13 |
| A9 | 125 | 321 | 3 | Presence | 7.1 | $Al_2O_3$ | 5nm | 75 | 12 |
| A10 | 120 | 450 | 4 | Presence | 9.1 | $ZrO_2$ | 4nm | 55 | 8 |
| A11 | 114 | 421 | 4 | Presence | 7.1 | $Al_2O_3$ | 5nm | 56 | 7 |
| A12 | 122 | 405 | 3 | Presence | 3.7 | $Si_3N_4$ | 5nm | 48 | 5 |
| A13 | 118 | 432 | 4 | Presence | 9.1 | $ZrO_2$ | 10nm | 45 | 4 |
| A14 | 121 | 456 | 4 | Presence | 7.1 | $Al_2O_3$ | 9nm | 36 | 2 |
| A15 | 125 | 432 | 3 | Presence | 3.7 | $Si_3N_4$ | 11nm | 25 | 0 |
| A16 | 122 | 49 | 0 | Presence | $Al_2O_3$(7.1), $TiO_2$(7.2) | | 5nm each | 132 | 19 |
| A17 | 131 | 55 | 0 | Presence | $Si_3N_4$(3.7), $TiO_2$(7.2) | | 5nm each | 110 | 17 |
| A18 | 135 | 61 | 0 | Presence | $Al_2O_3$(7.1), $TiO_2$(7.2), $Si_3N_4$(3.7) | | 5nm each | 95 | 12 |

FIG.30

\# THIN FILM CAPACITOR AND ELECTRONIC CIRCUIT SUBSTRATE HAVING THE SAME

CROSS REFERENCE TO RELATED APPLICATIONS

This application is the U.S. National Phase under 35 U.S.C. § 371 of International Application No. PCT/JP2020/048391, filed on Dec. 24, 2020, which claims the benefit of U.S. Provisional Application No. 63/045,579, filed on Jun. 29, 2020, the entire contents of each are hereby incorporated by reference.

TECHNICAL FIELD

The present invention relates to a thin film capacitor and an electronic circuit substrate having the same, and more particularly to a thin film capacitor using a metal foil and an electronic circuit substrate having the same.

BACKGROUND ART

A decoupling capacitor is generally mounted on an IC-mounted circuit board so as to stabilize the potential of a power supply to be fed to the IC. A laminated ceramic chip capacitor is typically used as the decoupling capacitor, and a required decoupling capacitance is ensured by mounting many laminated ceramic chip capacitors on the surface of a circuit board.

However, in recent years, a space for mounting many laminated ceramic chip capacitors is sometimes insufficient due to miniaturization of circuit boards. Thus, a thin film capacitor capable of being embedded in a circuit board is sometimes used in place of the laminated ceramic chip capacitor (see Patent Documents 1 to 4).

In the thin film capacitor described in Patent Document 1, a porous metal substrate is used, and an upper electrode is formed on the surface of the porous metal substrate through a dielectric film. In the thin film capacitor described in Patent Document 2, a metal substrate in which one main surface thereof is roughened is used, and an upper electrode is formed on the roughened surface of the metal substrate through a dielectric film. In the thin film capacitors described in Patent Documents 3 and 4, a conductive porous substrate is formed as a support part, and an upper electrode is formed on a roughened surface of the conductive porous substrate through a dielectric film.

CITATION LIST

Patent Document

[Patent Document 1] International Publication WO 2015/118901
[Patent Document 2] International Publication WO 2018/092722
[Patent Document 3] International Publication WO 2017/026247
[Patent Document 4] International Publication WO 2017/014020

SUMMARY OF THE INVENTION

Problem to be Solved by the Invention

However, the thin film capacitor described in Patent Document 1 has a side surface electrode structure, so that the line length of the electrode is long, which causes a structural problem of increasing an ESR (Equivalent Series Resistance and an ESL (Equivalent Series Inductance). In addition, the thin film capacitor described in Patent Document 1 uses a metal substrate which is made entirely porous, so that it is not easy to separate the lower electrode constituted by the metal substrate and the upper electrode covering the metal substrate through a dielectric film, which disadvantageously makes it likely to cause a short circuit failure. In the thin film capacitor described in Patent Document 2, one main surface of the metal substrate functions as an upper electrode, and the other surface thereof functions as a lower electrode, so that it is necessary to route the electrode through the side surface of the element in order to dispose a pair of terminal electrodes on the same plane, complicating the structure. In the thin film capacitors described in Patent Documents 3 and 4, a pair of terminal electrodes are disposed on both surfaces of a metal substrate, respectively, preventing access to the terminal electrode pair from one side. In addition, the presence of the support increases the entire thickness.

It is therefore an object of the present invention to provide an improved thin film capacitor and an electronic circuit substrate having the same.

Means for Solving the Problem

A thin film capacitor according to the present invention include: a metal foil having a roughened first porous layer positioned on one main surface side, a roughened second porous layer positioned on other main surface side, and a non-roughened non-porous layer positioned between the first and second porous layers; a first dielectric film covering the one main surface of the metal foil and having an opening through which the metal foil is partly exposed; a second dielectric film covering the other main surface of the metal foil and made of a dielectric material having a thermal expansion coefficient smaller than that of the metal foil; a first electrode layer contacting the metal foil through the opening; and a second electrode layer contacting the first dielectric film without contacting the metal foil.

A manufacturing method for a thin film capacitor according to the present invention includes: forming first and second porous layers on both sides of a non-roughened non-porous layer by roughening one and the other main surfaces of a metal foil; forming a first dielectric film on the roughened one main surface of the metal foil; forming a second dielectric film having a thermal expansion coefficient smaller than that of the metal foil on the roughened one main surface of the metal foil; removing a part of the first dielectric film to expose a part of the metal foil; and forming a first electrode layer that contacts the part of the metal foil and the dielectric film and a second electrode layer that contacts the first dielectric film without contacting the part of the metal foil.

Advantageous Effects of the Invention

According to the present invention, an opening is formed in a part of the dielectric film, so that it is possible to dispose a pair of terminal electrodes on the same plane without using a side surface electrode or the like. In addition, since the other main surface of the metal foil is covered with the second dielectric film having small thermal expansion coefficient, making it possible to prevent the occurrence of warpage.

BRIEF DESCRIPTION OF THE DRAWINGS

FIG. 1A is a schematic cross-sectional view for explaining the structure of a thin film capacitor 1 according to an embodiment of the present invention.

FIG. 1B is a schematic plan view of the thin film capacitor 1.

FIG. 6 is a process view for explaining the manufacturing method for the thin film capacitor 1.

FIG. 20A is a process view for explaining the manufacturing method for the thin film capacitor 1.

FIG. 20B is a schematic plan view of FIG. 20A.

FIG. 23A is a process view for explaining the manufacturing method for the thin film capacitor 1.

FIG. 23B is a schematic plan view of FIG. 23A.

FIG. 24A is a process view for explaining the manufacturing method for the thin film capacitor 1.

FIG. 24B is a schematic plan view of FIG. 24A.

FIG. 26A is a process view for explaining the manufacturing method for the thin film capacitor 1.

FIG. 26B is a schematic plan view of FIG. 26A.

FIG. 27 is a process view for explaining the manufacturing method for the thin film capacitor 1.

FIG. 30 is a table indicating an evaluation results of samples.

MODE FOR CARRYING OUT THE INVENTION

Figure 1C:
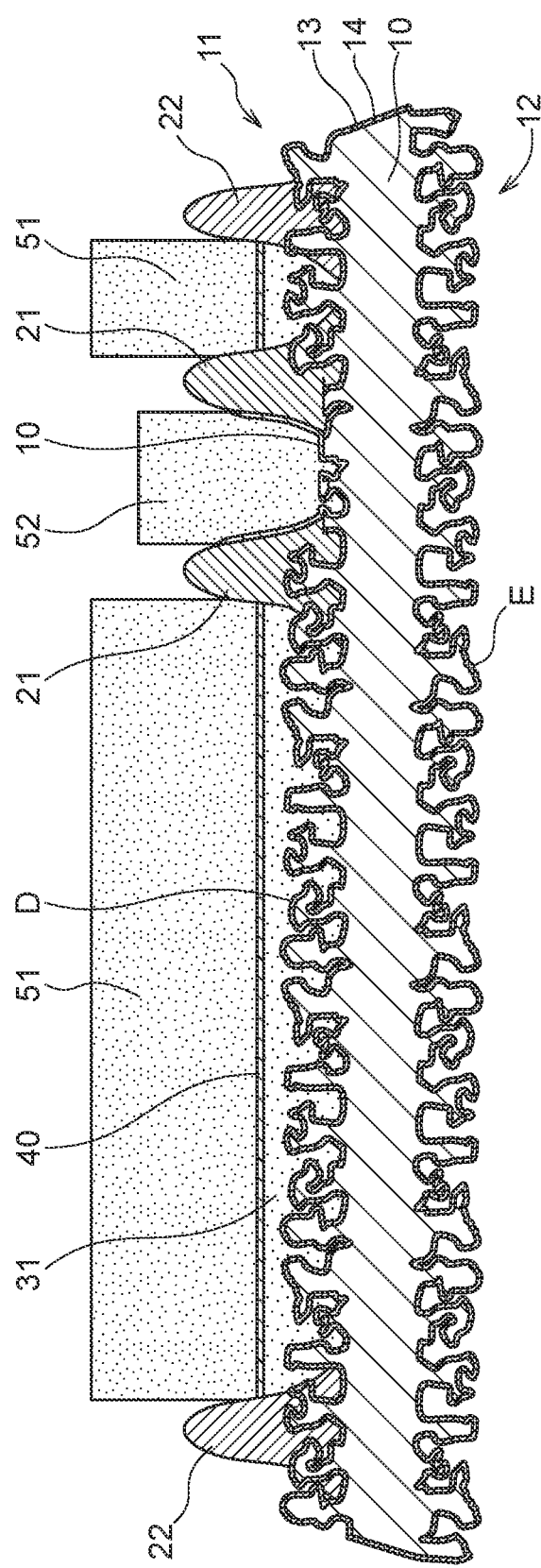
FIG. 1C is a schematic cross-sectional view illustrating an example in which a conductive member 32 is omitted from the thin film capacitor 1.

Hereinafter, a preferred embodiment of the present invention will be described in detail with reference to the accompanying drawings.

FIG. 1A is a schematic cross-sectional view for explaining the structure of a thin film capacitor 1 according to an embodiment of the present invention. FIG. 1B is a schematic plan view of the thin film capacitor 1.

As illustrated in FIGS. 1A and 1B, the thin film capacitor 1 includes a metal foil 10, ring-shaped or polygonal annular insulating members 21 and 22 formed on an upper surface 11 of the metal foil 10, conductive members 31 and 32 formed on the upper surface 11 of the metal foil 10 and partitioned by the insulating members 21 and 22, a terminal electrode 51 connected to the conductive member 31 through a seed layer 40, and a terminal electrode 52 connected to the conductive member 32 through the seed layer 40. The metal foil 10 is made of a metal material such as aluminum, copper, chrome, nickel, or tantalum, and upper and lower surfaces 11 and 12 thereof positioned on the mutually opposite sides are each at least partly roughened. Aluminum is most preferable as the material of the metal foil 10. Dielectric films D and E are formed on the upper and lower surfaces 11 and 12 of the metal foil 10, respectively. The insulating members 21 and 22 are each made of, for example, resin. The conductive members 31 and 32 are each made of, for example, a conductive polymer material. The seed layer 40 and terminal electrodes 51 and 52 are each made of, for example, copper, nickel, or gold, an alloy thereof, or a layer structure thereof.

Figure 1D:
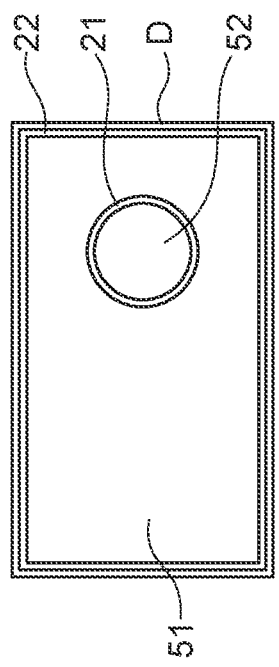
FIG. 1D is a schematic plan view of the thin film capacitor 1 illustrated in FIG. 1C.

The ring-shaped or polygonal annular insulating member 21 is provided in a slit that electrically isolating an electrode layer including the terminal electrode 51 and conductive member 31 from an electrode layer including the terminal electrode 52 and conductive member 32. The terminal electrode 52 and conductive member 32 are positioned within an area surrounded by the insulating member 21, and the terminal electrode 51 and conductive member 31 are positioned outside the area surrounded by the insulating member 21 and within an area surrounded by the insulating member 22. In the area surrounded by the insulating member 21, a part of or the entire dielectric film D formed on the upper surface 11 of the metal foil 10 is removed, and thus an opening is formed in the dielectric film D. As a result, the terminal electrode 52 is electrically connected to the metal foil 10 through the conductive member 32. Alternatively, as illustrated in FIGS. 1C and 1D, the conductive member 32 may be omitted to connect the metal foil 10 and terminal electrode 52 directly or through the seed layer 40. On the other hand, at the outside of the area surrounded by the insulating member 21, the dielectric film D formed on the upper surface 11 of the metal foil 10 is not removed. That is, the conductive member 31 contacts the dielectric film D without contacting the metal foil 10, so that the terminal electrode 51 and metal foil 10 are electrically isolated from each other. Thus, the terminal electrodes 51 and 52 function as a pair of capacitance electrodes opposite to each other through the dielectric film D. The dielectric film D is formed on the roughened upper surface 11 of the metal foil 10, that is, the surface area of the upper surface 11 is increased, allowing a large capacitance to be obtained.

At the outside of the area surrounded by the insulating member 22, the dielectric film D formed on the upper surface 11 of the metal foil 10 is exposed. The roughened surface is thus exposed at the outer peripheral portion of the thin film capacitor 1, so that adhesion when the thin film capacitor 1 is embedded in a multilayer substrate can be enhanced. A side surface 13 of the metal foil 10 is not roughened and is covered with an insulating film 14. The ring-shaped or polygonal annular insulating member 22 exists between the conductive member 31 and the side surface 13 of the metal foil 10, and a clearance area where no conductive member exists is provided at the outside of the ring-shaped or polygonal annular insulating member 22, so that even when the insulating film 14 is thin, a short circuit between the conductive member 31 and metal foil 10 is prevented.

The dielectric film D is made of a dielectric material such as $Al_2O_3$, $TiO_2$, $Ta_2O_5$, and $SiN_x$. Amorphous may be used as the material of the dielectric film D. In this case, the composition ratio of the dielectric film D is not always the same as the composition ratio described above. The dielectric film E covering the lower surface 12 of the metal foil 10 may be a film made of a dielectric material same as or different from that of the dielectric film D. Specific examples include $Al_2O_3$, $TiO_2$, $Ta_2O_5$, $SiN_x$, $ZrO_2$, $CaZrO_3$, $BaTiO_2$. The dielectric film E plays a role of insulating the lower surface 12 of the metal foil 10 and suppressing warpage of the thin film capacitor 1. Further, the dielectric film E may have a barrier function of shutting off reaction product gas. With this function, it is possible to prevent intrusion of the reaction product gas generated from resin constituting the multilayer substrate at the time of curing the multilayer substrate.

The thin film capacitor 1 can be used as a decoupling capacitor when being embedded in a multilayer substrate. The thickness of the thin film capacitor 1 is as very thin as, for example, 50 μm or less. Thus, when the terminal electrode 51 and the conductive member 31 are formed on the upper surface 11 side, the thin film capacitor 1 is more likely to protrude toward the lower surface 12 side. Therefore, in order to suppress such warpage, it is necessary to select, as the material of the dielectric film E, a material having a thermal expansion coefficient smaller than that of the metal foil 10. Specifically, the thermal expansion coefficient is preferably 10 ppm/° C. or less. In order to suppress warpage of the thin film capacitor 1 more effectively, the film thickness of the dielectric film E is preferably larger than that of the dielectric film D.

For further reduction of warpage of the thin film capacitor 1, it is preferable to satisfy $Rq2>Rq1$, where $Rq1$ is the surface roughness Rq (root mean square height) of the upper surface 11 of the metal foil 10, and $Rq2$ is the surface roughness Rq (root mean square height) of the lower surface 12 of the metal foil 10, and more preferably, $Rq2/Rq1$ is set to 1.8 or more.

The crystal particle diameter of the center portion (non-roughened portion) of the metal foil 10 is preferably less than 15 μm in the planar direction (direction parallel to the upper and lower surfaces 11 and 12) and less than 5 μm in the thickness direction (direction orthogonal to the upper and lower surfaces 11 and 12), and crystal orientations are preferably aligned with the planar direction as much as possible. This can enhance the positional accuracy of the side surface 13 as will be described later.

Figure 2:
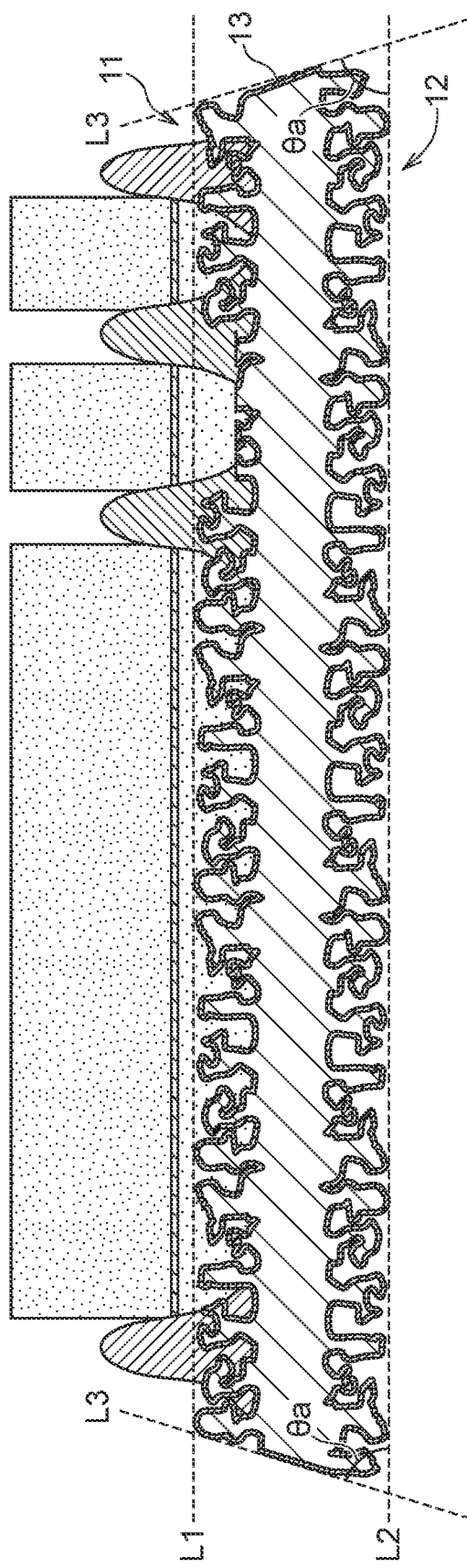
FIG. 2 is a schematic cross-sectional view for explaining the shape of a side surface 13 of the thin film capacitor 1.

In order to more suppress warpage of the thin film capacitor 1, the following configuration is preferable. That is, when a straight line L1 extending along the upper surface 11, a straight line L2 extending along the lower surface 12, and a straight line L3 extending along the side surface 13 are defined in the cross section illustrated in FIG. 2, an angle θa formed by the straight lines L2 and L3 is preferably more than 20° and less than 80° ($20°<θa<80°$). This means that the lower surface 12 preferably has a larger area than the upper surface 11. This improves adhesion between the side surface 13 of the thin film capacitor 1 and the multilayer substrate, thus making it possible to increase strength and reliability of the thin film capacitor 1. In this case, $30°≤θa≤60°$ is more preferably satisfied. When the angle θa is designed to fall within the above range, warpage of the thin film capacitor 1 at the time of mounting is reduced, and a contact area between the side surface 13 and the insulating resin constituting the multilayer substrate is controlled optimally, so that strength and reliability of the thin film capacitor 1 can be further improved. The side surface 13 may be curved such that the angle θa becomes larger toward the upper surface 11 and becomes smaller toward the lower surface 12. When the angle θa is not constant as just described, the value of the angle θa is defined by an average value.

The following describes an example of a manufacturing method for the thin film capacitor 1.

Figure 3:
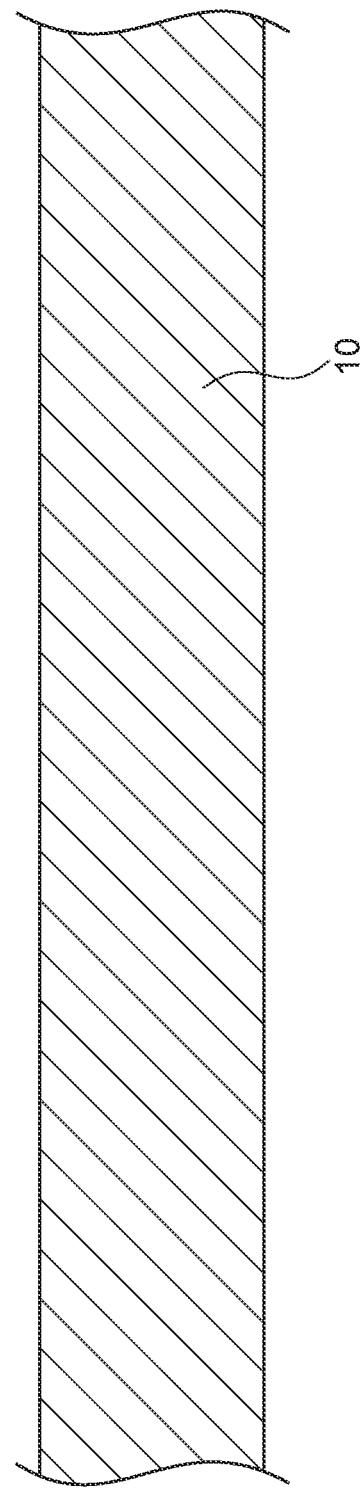
FIG. 3 is a process view for explaining a manufacturing method for the thin film capacitor 1.
Figure 4:
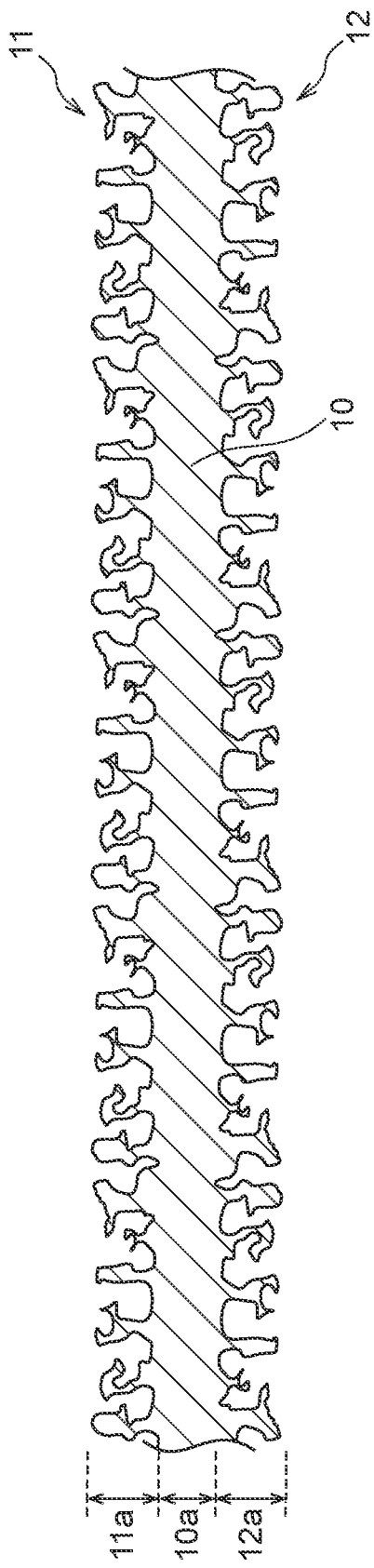
FIG. 4 is a process view for explaining the manufacturing method for the thin film capacitor 1.

First, the metal foil 10 made of aluminum with a thickness of about 50 μm is prepared (FIG. 3), and the upper and lower surfaces 11 and 12 are each etched for roughening (FIG. 4). In place of roughening the flat metal foil 10, the metal foil 10 may be formed by sintering metal powder. As a result, there are formed, in the metal foil 10, a porous layer 11a positioned on the upper surface 11 side and a porous layer 12a positioned on the lower surface 12 side. A non-porous layer 10a, which is not subjected to roughening, is positioned between the porous layers 11a and 12a. At this time, it is sufficient to apply roughening to at least the upper surface 11, and the lower surface 12 may not necessarily be roughened; however, roughening both the upper and lower surfaces 11 and 12 can prevent warpage of the metal foil 10. The upper surface 11 is preferably etched under a condition that the surface area thereof is increased as much as possible. When both the upper and lower surfaces 11 and 12 are roughened, they may be etched under different etching conditions. For example, the lower surface 12 may be roughened under a condition that adhesion with respect to the multilayer substrate is enhanced as much as possible.

Figure 5:
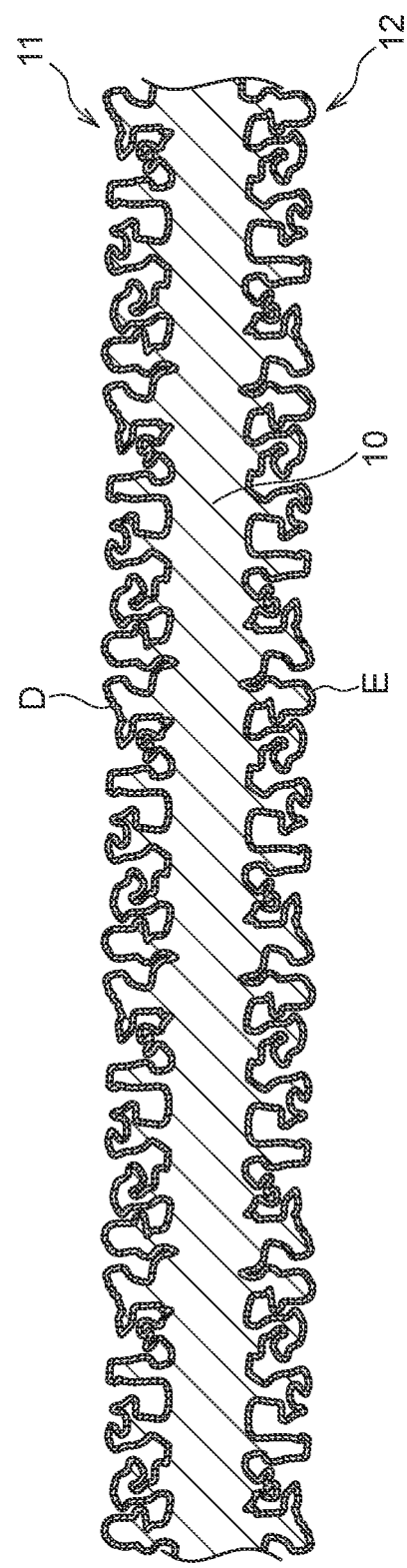
FIG. 5 is a process view for explaining the manufacturing method for the thin film capacitor 1.

Then, the dielectric film D is formed on the upper surface 11 of the metal foil 10, and the dielectric film E is formed on the lower surface 12 of the metal foil 10 (FIG. 5). The dielectric films D and E may be formed through oxidation of the metal foil 10 or using a film forming method excellent in coverage performance, such as an ALD method, a CVD method, or a mist CVD method. As described above, the dielectric film E may be a film made of a dielectric material same as or different from that of the dielectric film D. After formation of the dielectric films D and E, a base material 60 for conveyance is stuck to the lower surface 12 of the metal foil 10 (FIG. 6).

Figure 7A:
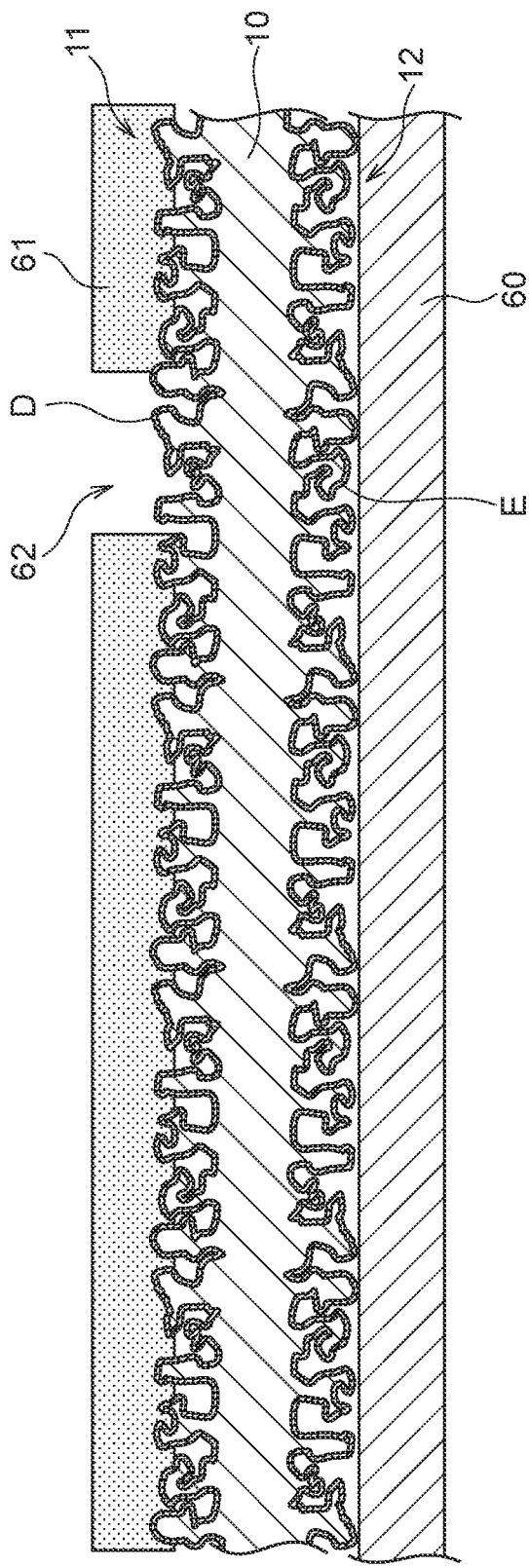
FIG. 7A is a process view for explaining the manufacturing method for the thin film capacitor 1.
Figure 7B:
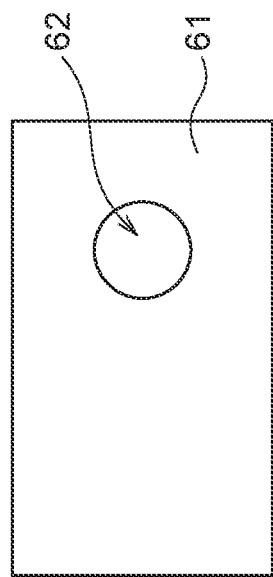
FIG. 7B is a schematic plan view of FIG. 7A.

Then, a photosensitive resist is formed on the upper surface 11 of the metal foil 10, followed by exposure and development, to form a patterned resist 61 (FIGS. 7A and 7B). The resist 61 has an opening 62 for exposing the dielectric film D therethrough. The resist may be a positive type or a negative type.

Figure 8A:
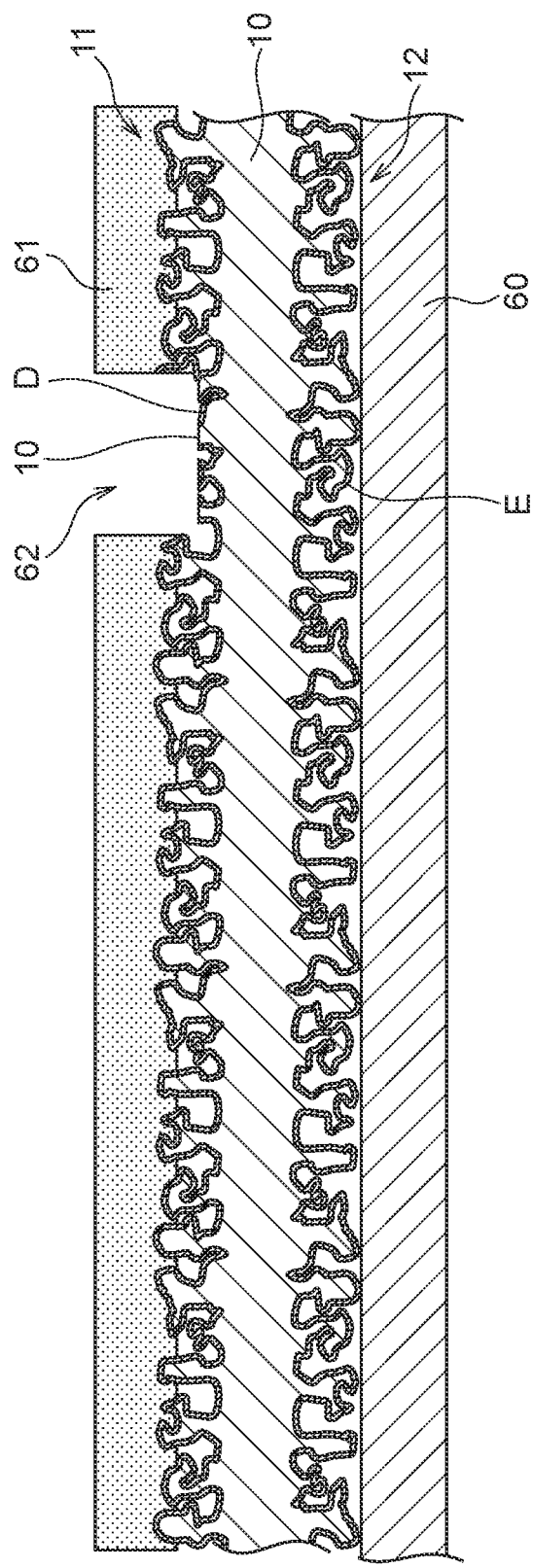
FIG. 8A is a process view for explaining the manufacturing method for the thin film capacitor 1.
Figure 8B:
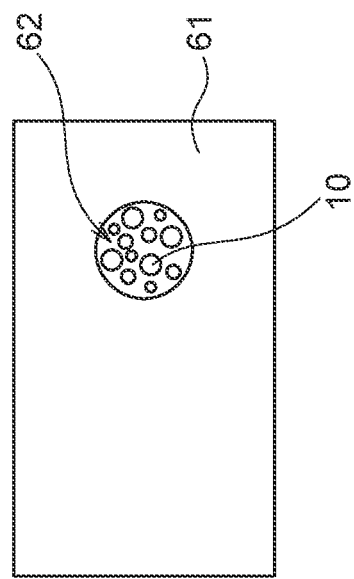
FIG. 8B is a schematic plan view of FIG. 8A.
Figure 9:
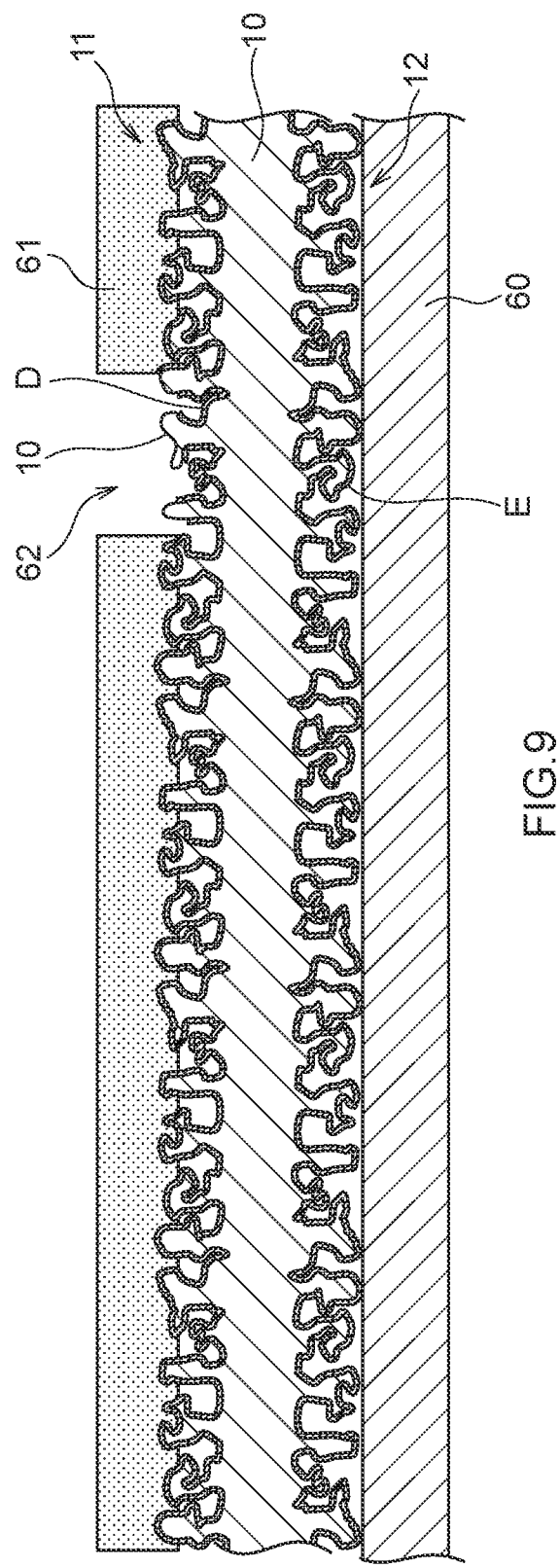
FIG. 9 is a process view for explaining the manufacturing method for the thin film capacitor 1.

Then, a part of or the entire dielectric film D is removed with the resist 61 used as a mask to expose the metal foil 10 through the opening 62 (FIGS. 8A and 8B). The dielectric film D can be removed using a reverse sputtering method, an ion milling method, a RIE method, a wet etching method, or the like. At this stage, the upper surface 11 of the metal foil 10 has already been roughened, so that by using the reverse sputtering method, ion milling method, RIE method or the like, it is possible to prevent spread of an etchant due to a capillary phenomenon. However, a liquid etchant may be used in this process. Although the surface of the exposed metal foil 10 and the dielectric film D constitute substantially the same plane in the example illustrated in FIG. 8A, the roughened metal foil 10 can protrude from the dielectric film D in some etching condition as illustrated in FIG. 9.

Figure 10:
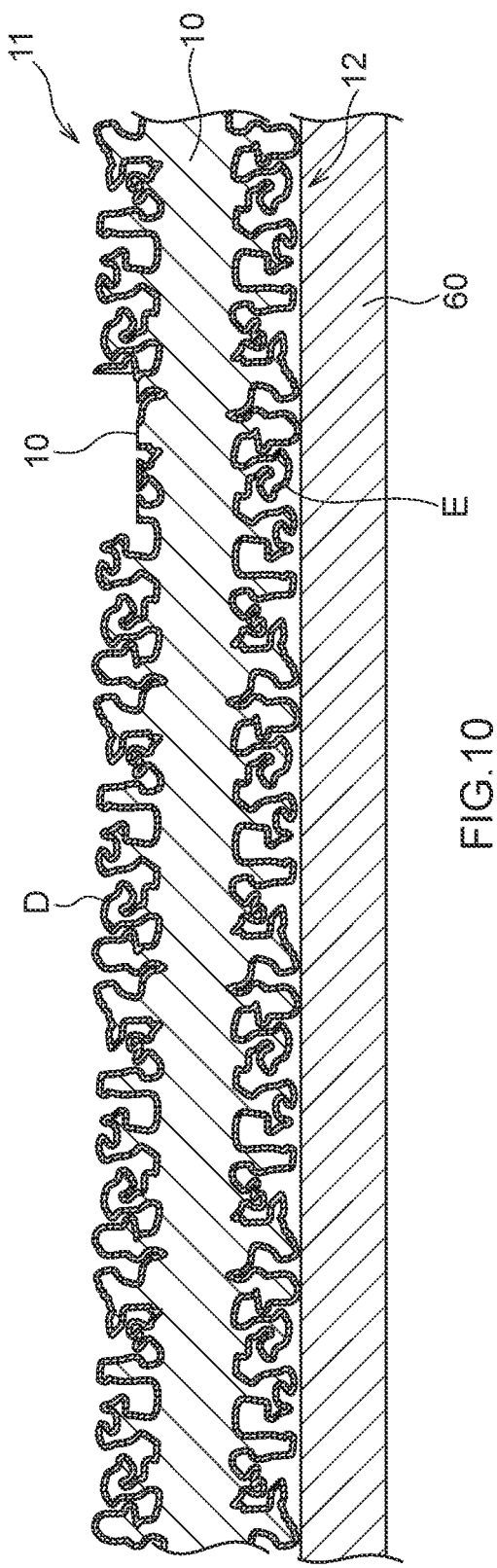
FIG. 10 is a process view for explaining the manufacturing method for the thin film capacitor 1.
Figure 11A:
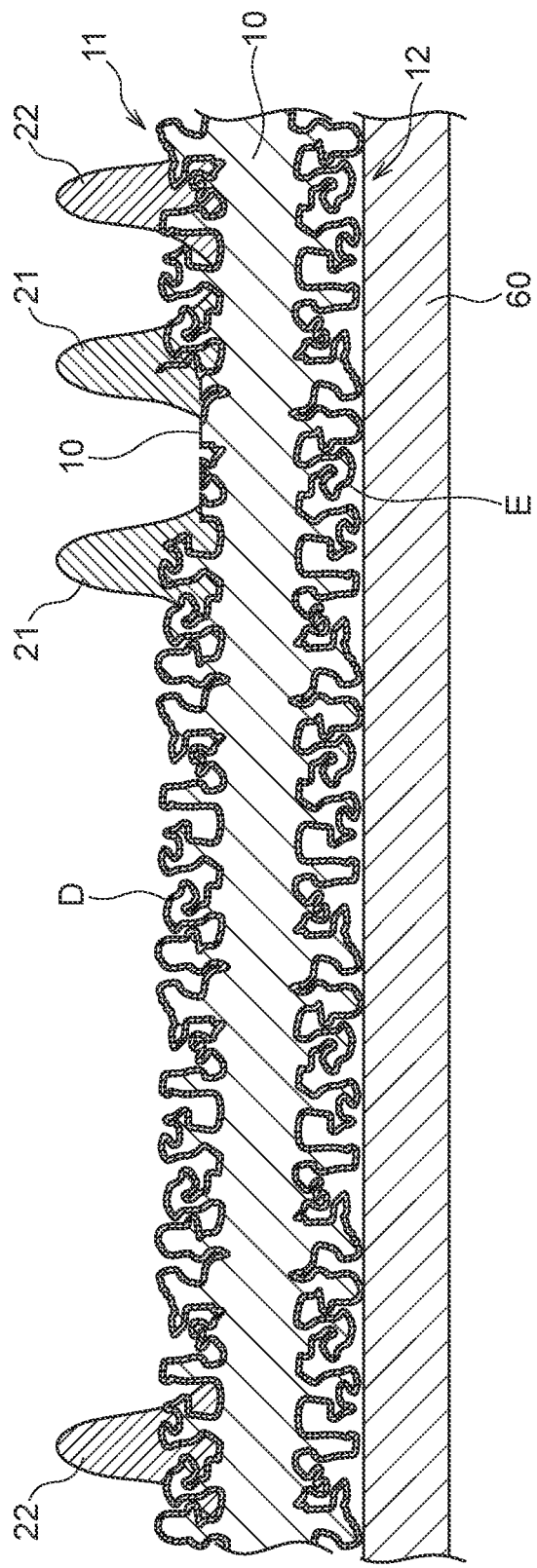
FIG. 11A is a process view for explaining the manufacturing method for the thin film capacitor 1.
Figure 11B:
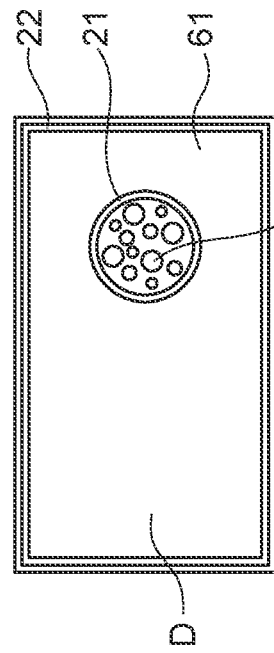
FIG. 11B is a schematic plan view of FIG. 11A.
Figure 12A:
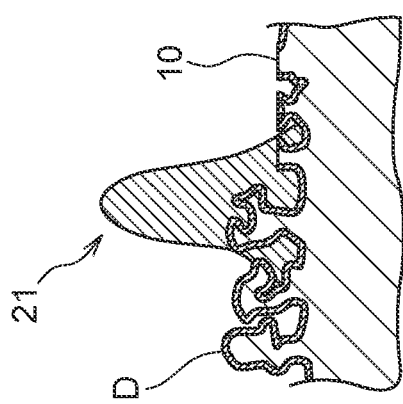
FIG. 12A is a schematic cross-sectional view illustrating an example of the formation position of an insulating member 21.
Figure 12B:
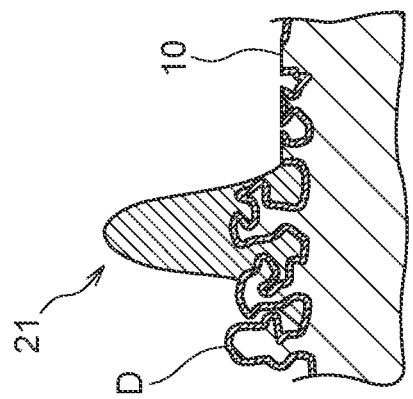
FIG. 12B is a schematic cross-sectional view illustrating another example of the formation position of an insulating member 21.
Figure 13:
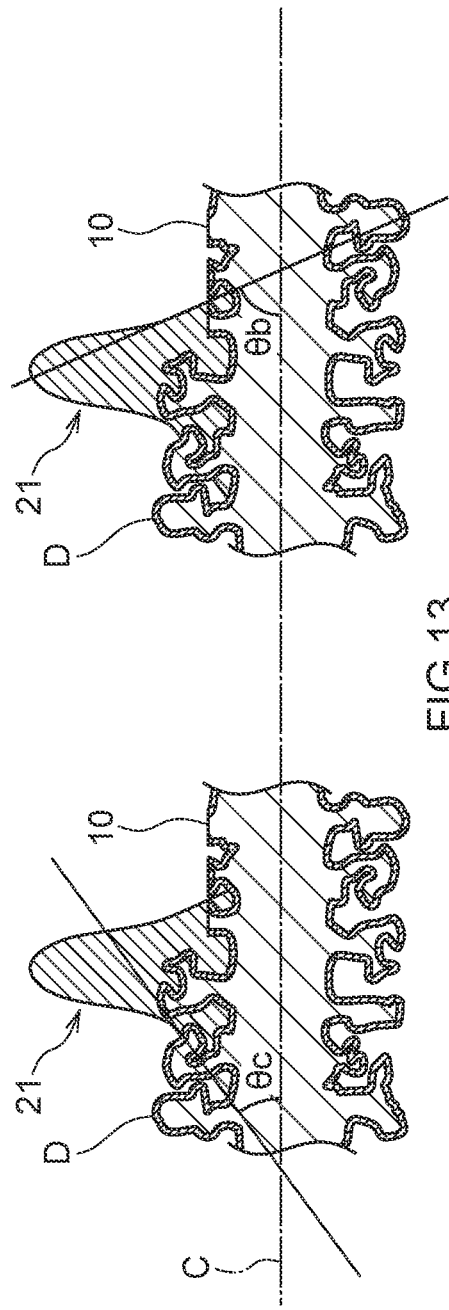
FIG. 13 is a schematic cross-sectional view illustrating an example of the shape of the insulating member 21.

Then, after removal of the resist 61 (FIG. 10), the insulating members 21 and 22 are formed on the upper surface 11 of the metal foil 10 (FIGS. 11A and 11B). The insulating members 21 and 22 can be formed by a photolithography patterning method, a screen printing method, a gravure printing method, an inkjet method, or the like. As a result, the insulating members 21 and 22 each have a tapered cross section as illustrated in FIG. 11A. The insulating member 21 may overlap (FIG. 12A) or may not overlap (FIG. 12B) a portion at which the metal foil 10 is exposed. Further, the insulating members 21 and 22 each may not necessarily have a symmetric cross section and, as illustrated in FIG. 13, an angle θc of the outer part of the ring with respect to a center line C in the thickness direction of the metal foil 10 may be made smaller than an angle θb of the inner part of the ring with respect to the center line C to make wider the taper surface at the ring outer part than the taper surface at the ring inner part. The insulating member 21 contacts the conductive member 32 or terminal electrode 52 at the inner side surface thereof and contacts the conductive member 31 or terminal electrode 51 at the outer side surface thereof. With the above structure, abnormal stress is not generated during a contraction process in the formation of the insulating members 21 and 22, making it possible to reduce the occurrence of cracks at the roughened portion to thereby improve manufacturing yield.

Figure 14A:
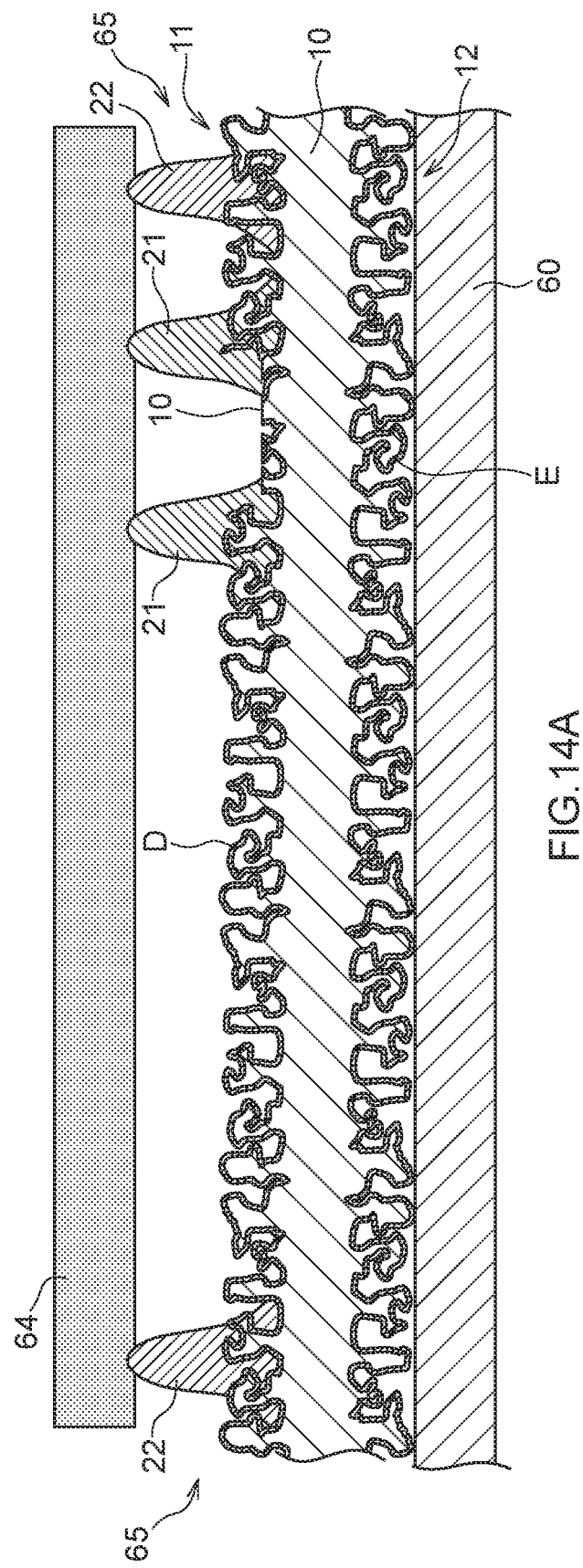
FIG. 14A is a process view for explaining the manufacturing method for the thin film capacitor 1.
Figure 14B:
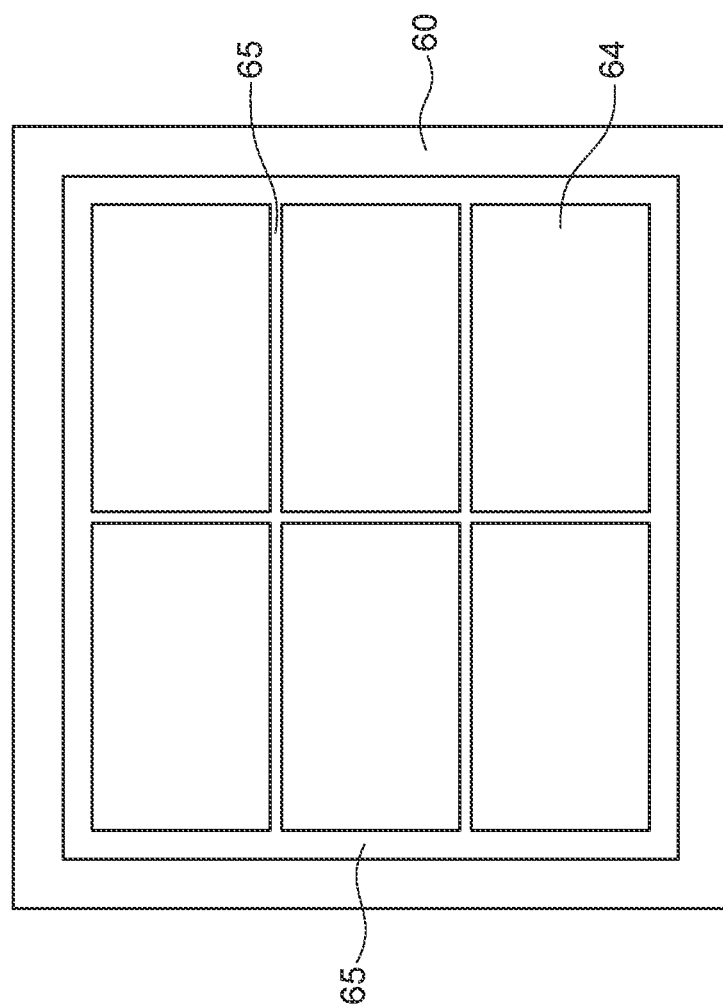
FIG. 14B is a schematic plan view of FIG. 14A.

Then, a photosensitive resist is formed on the upper surface 11 of the metal foil 10, followed by exposure and development, to form a patterned resist 64 (FIGS. 14A and 14B). The resist 64 has an opening 65 for exposing therethrough an area outside the insulating member 22. The resist may be a positive type or a negative type.

Figure 15A:
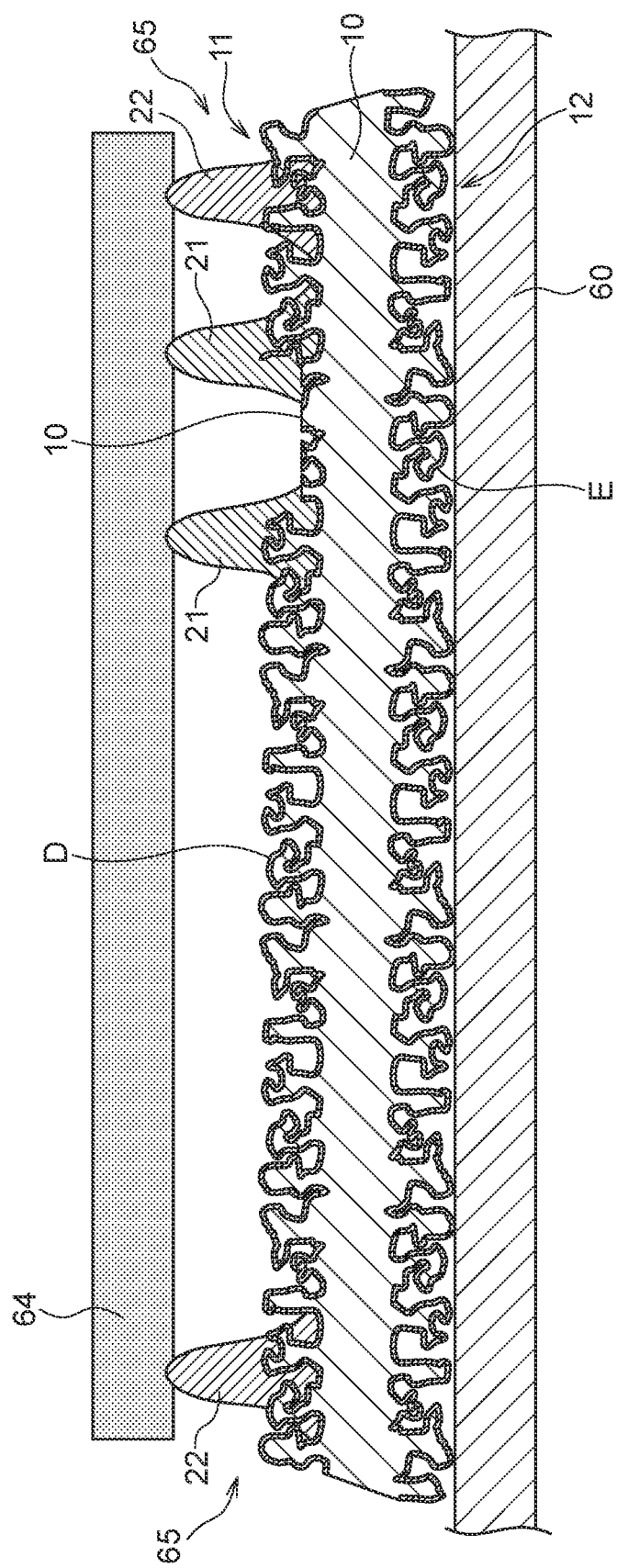
FIG. 15A is a process view for explaining the manufacturing method for the thin film capacitor 1.
Figure 15B:
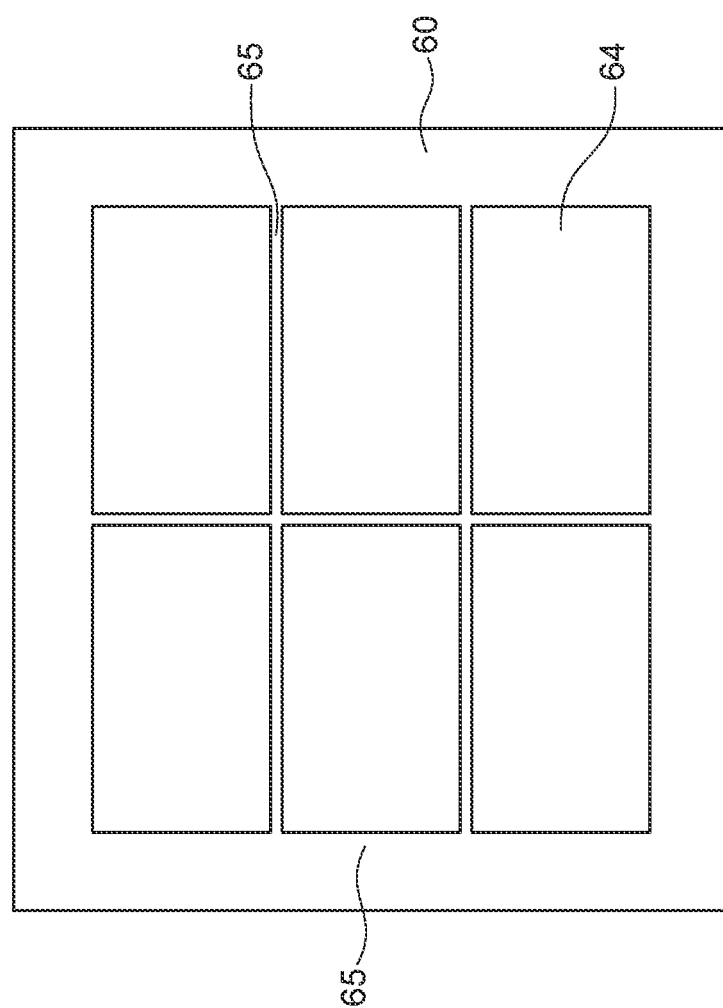
FIG. 15B is a schematic plan view of FIG. 15A.

Then, the metal foil 10 is removed with the resist 64 used as a mask to individualize the metal foil 10 (FIGS. 15A and 15B). The metal foil 10 can be removed by a wet etching method using an etchant such as acid. In this case, even when a liquid etchant is used, it does not spread beyond the insulating member 22.

Figure 16A:
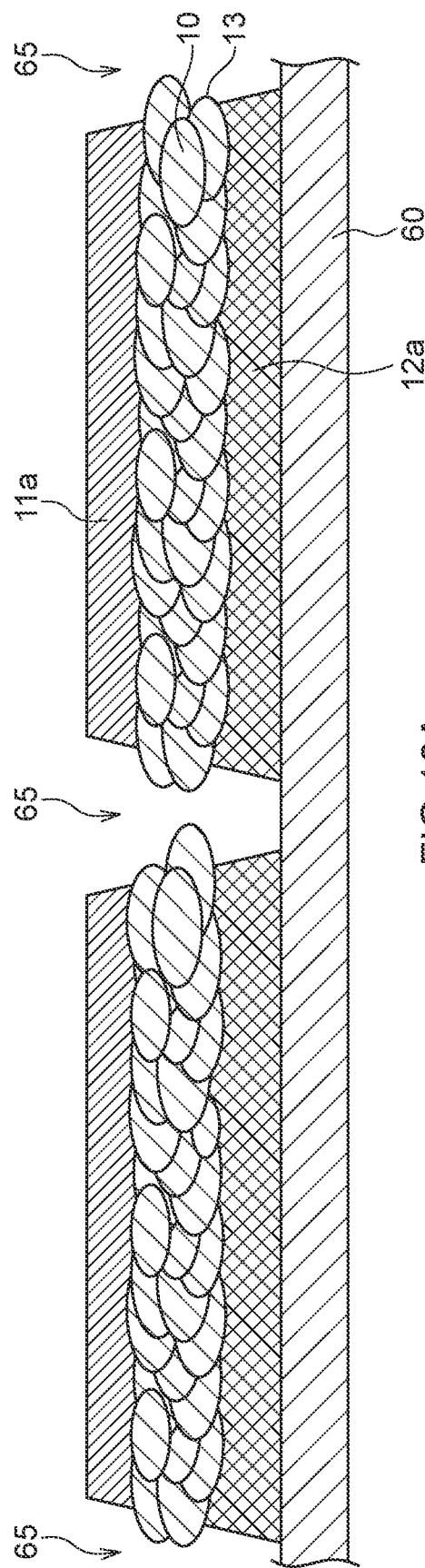
FIG. 16A is a schematic cross-sectional view illustrating a case where the crystal particle diameter of a metal foil 10 is large.
Figure 16B:
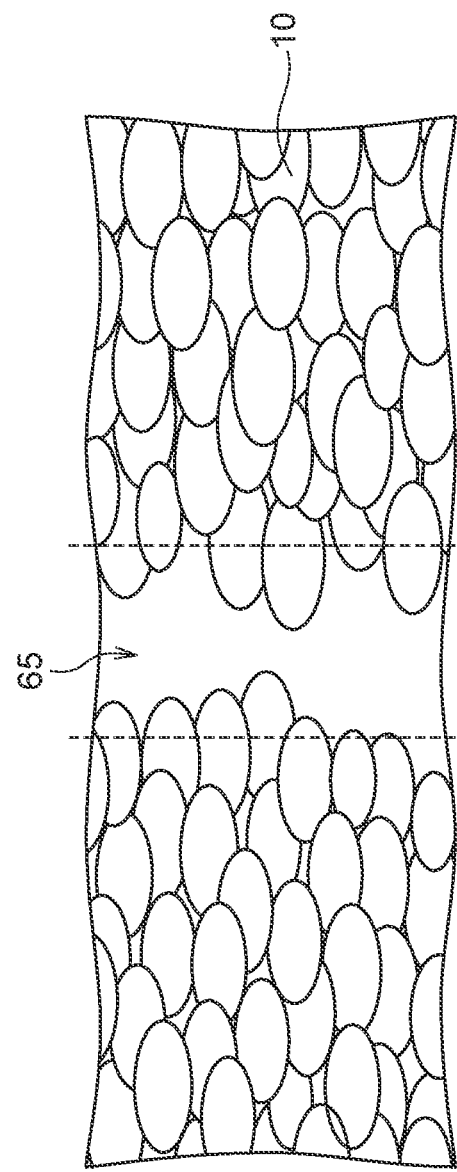
FIG. 16B is a schematic plan view of FIG. 16A.
Figure 17A:
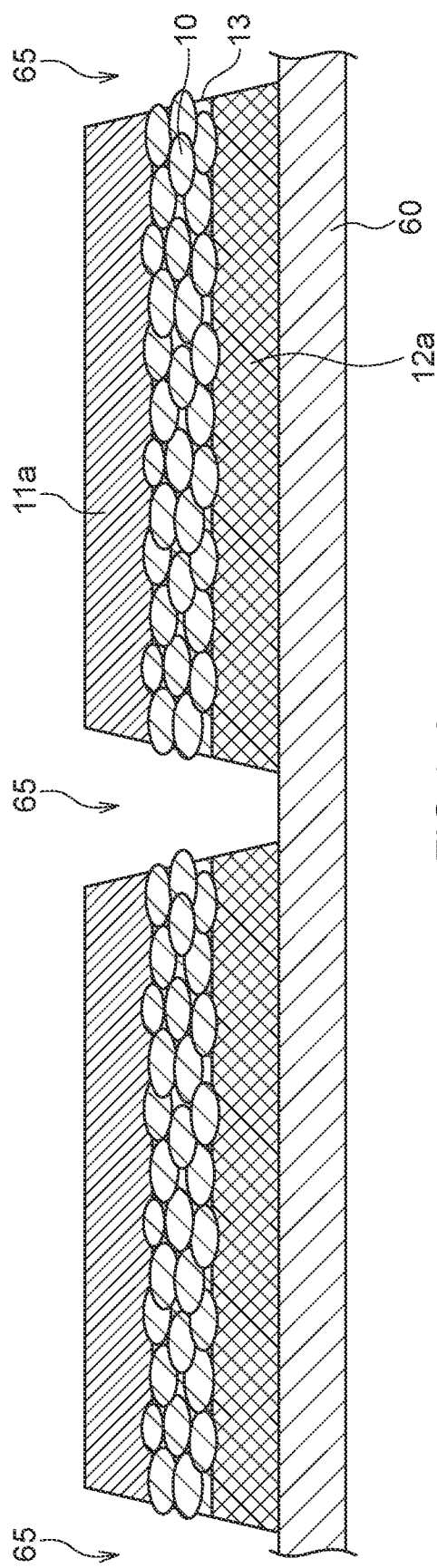
FIG. 17A is a schematic cross-sectional view illustrating a case where the crystal particle diameter of a metal foil 10 is small.
Figure 17B:
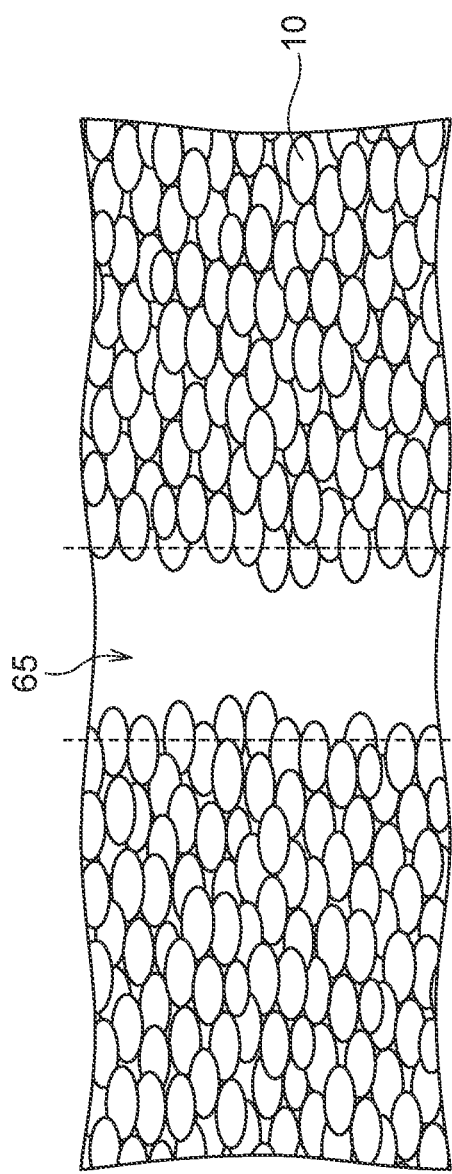
FIG. 17B is a schematic plan view of FIG. 17A.

To individualize the metal foil 10 more accurately, the crystal particle diameter of the center portion (non-roughened portion) of the metal foil 10 is preferably less than 15 μm in the planar direction and less than 5 μm in the thickness direction, as described above. When the crystal particle diameter of the metal foil 10 is 15 μm or more in the planar direction and 5 μm or more in the thickness direction, crystal particles protrude from the inner wall of the side surface 13 as illustrated in FIGS. 16A and 16B to increase a variation in the size of the individualized metal foil 10. On the other hand, when the crystal particle diameter of the metal foil 10 is less than 15 μm in the planar direction and less than 5 μm in the thickness direction, the crystal particles appearing at the side surface 13 are small in size as illustrated in FIGS. 17A and 17B, thereby reducing variation in the size of the individualized metal foil 10.

Figure 18:
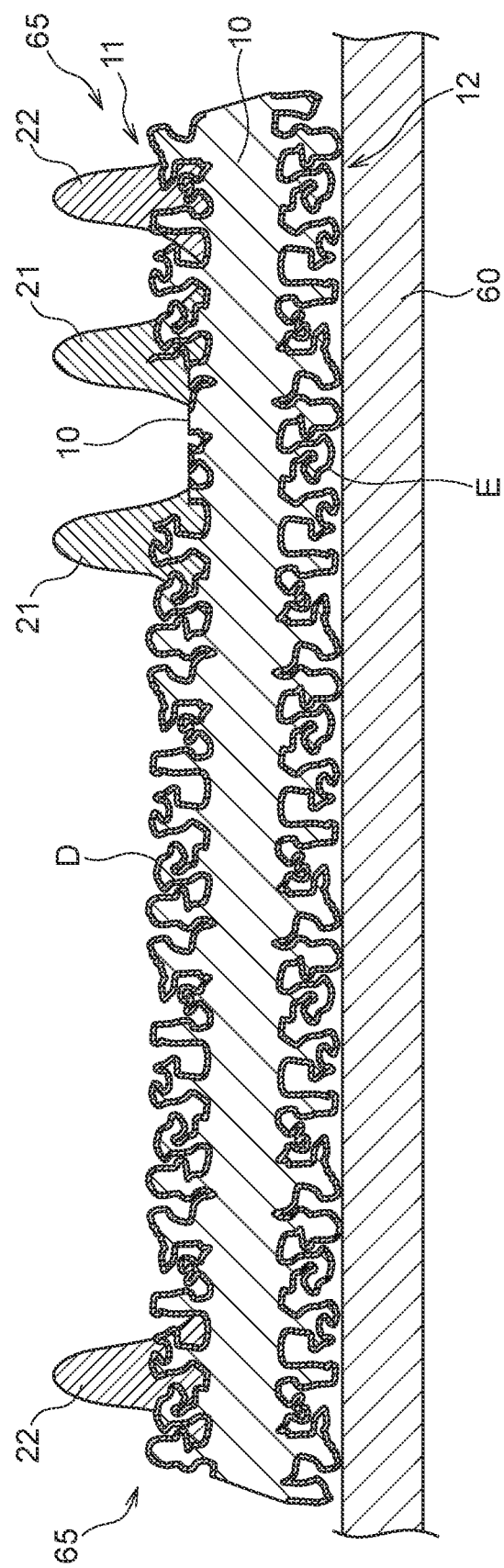
FIG. 18 is a process view for explaining the manufacturing method for the thin film capacitor 1.
Figure 19:
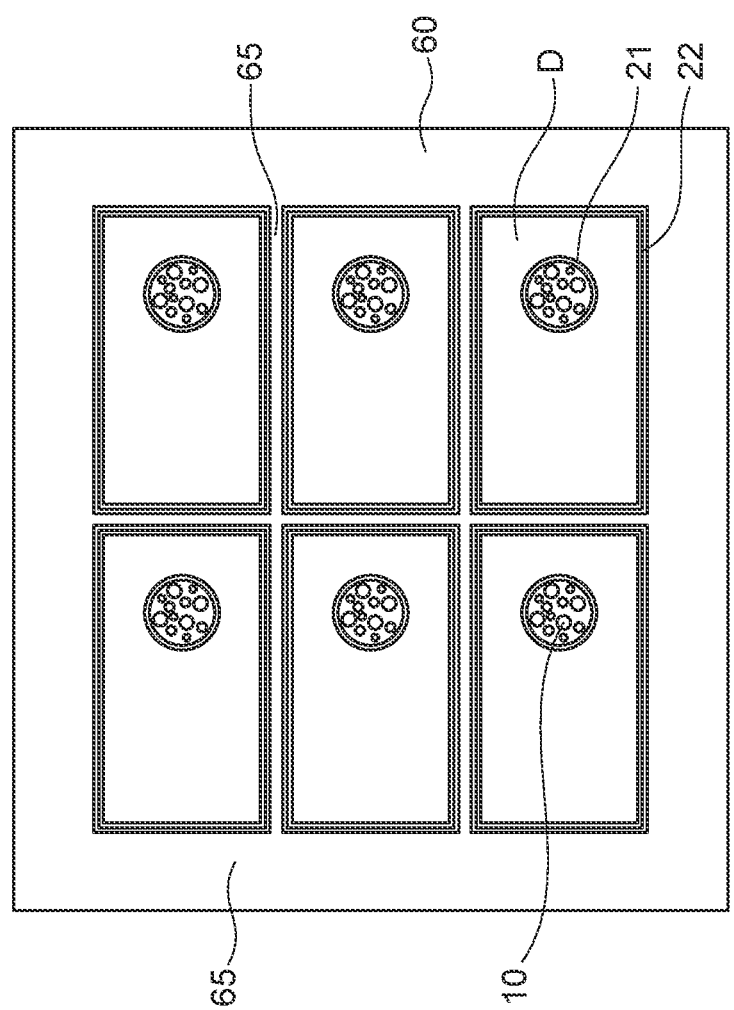
FIG. 19 is a schematic plan view of FIG. 18.

Then, after removal of the resist 64 (FIGS. 18 and 19), the conductive members 31 and 32 in a paste or liquid form each made of a conductive polymer material are formed in an area surrounded by the insulating member 22 (FIGS. 20A and 20B). Specifically, the conductive member 32 is positioned within an area surrounded by the insulating member 21, and the conductive member 31 is positioned outside the area surrounded by the insulating member 21 and within an area surrounded by the insulating member 22. The conductive members 31 and 32 are in a paste or liquid form and are thus filled up to the bottom of the porous layer 11a due to capillary action. As a result, the conductive member 31 contacts the dielectric film D without contacting the metal foil 10, while the conductive member 32 contacts the metal foil 10. Note that the terminal electrode 52 may be directly formed without forming the conductive member 32.

Figure 21:
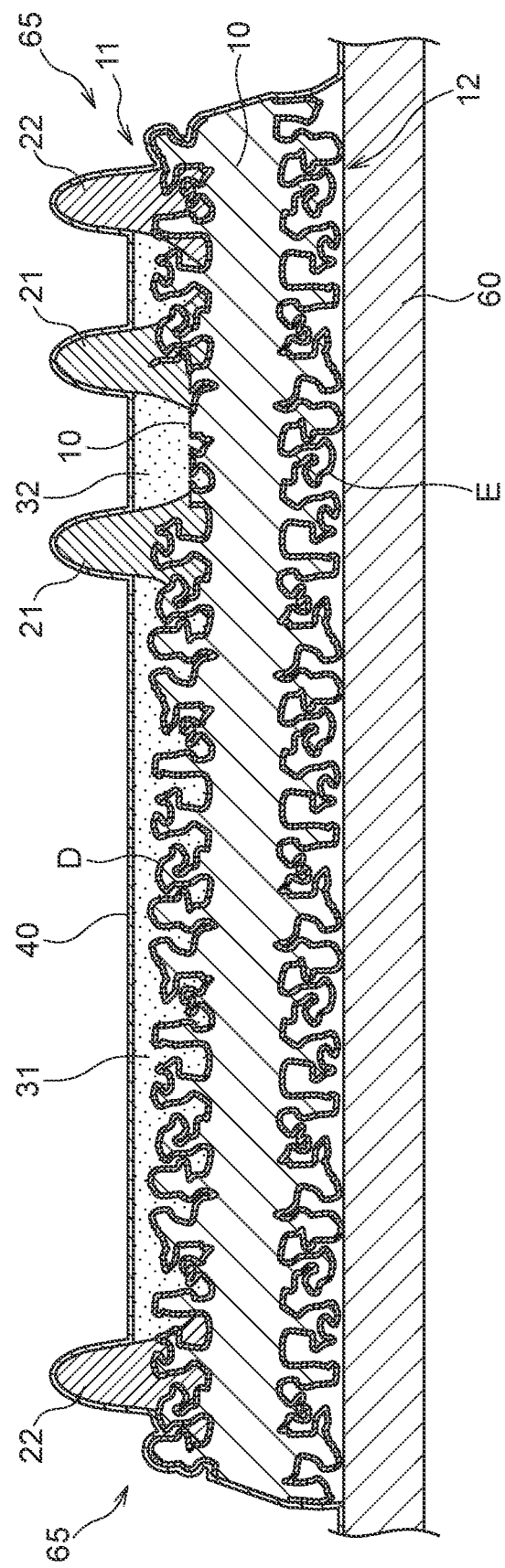
FIG. 21 is a process view for explaining the manufacturing method for the thin film capacitor 1.
Figure 22A:
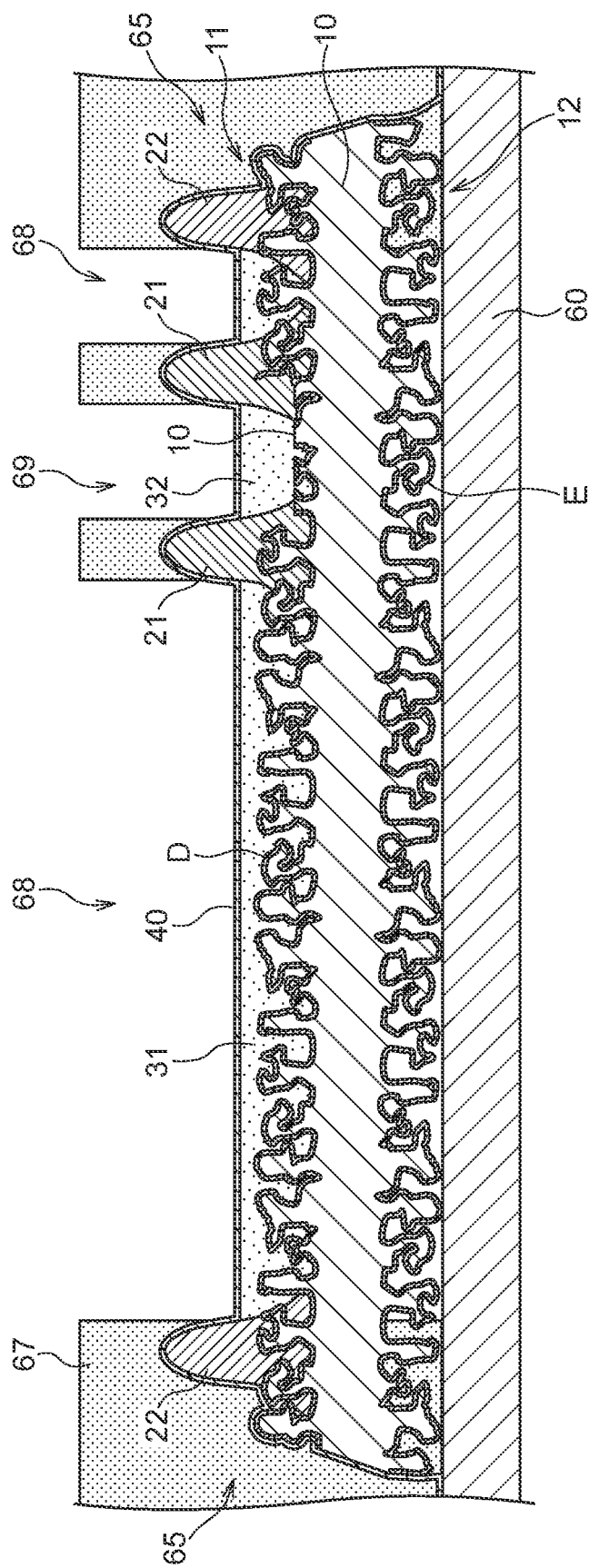
FIG. 22A is a process view for explaining the manufacturing method for the thin film capacitor 1.
Figure 22B:
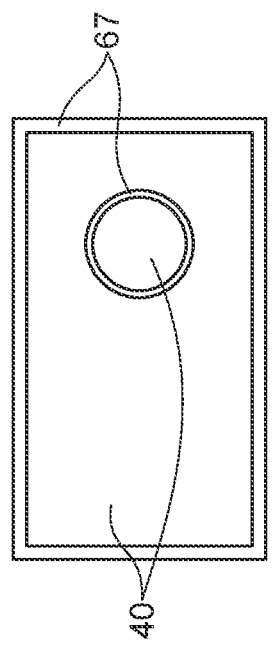
FIG. 22B is a schematic plan view of FIG. 22A.

Then, the seed layer 40 is formed on the entire surface (FIG. 21). The seed layer 40 can be formed using a sputtering method or the like. Subsequently, a photosensitive resist is formed on the upper surface 11 of the metal foil 10, followed by exposure and development, to form a patterned resist 67 (FIGS. 22A and 22B). The resist 67 has openings 68 and 69. The opening 68 is positioned within the area surrounded by the insulating member 22 and outside the area surrounded by the insulating member 21. The opening 69 is positioned within the area surrounded by the insulating member 21. As a result, a part of the seed layer 40 that covers the conductive member 31 is exposed through the opening 68, and a part thereof that covers the conductive member 32 is exposed through the opening 69. The resist may be a positive type or a negative type.

Figure 25A:
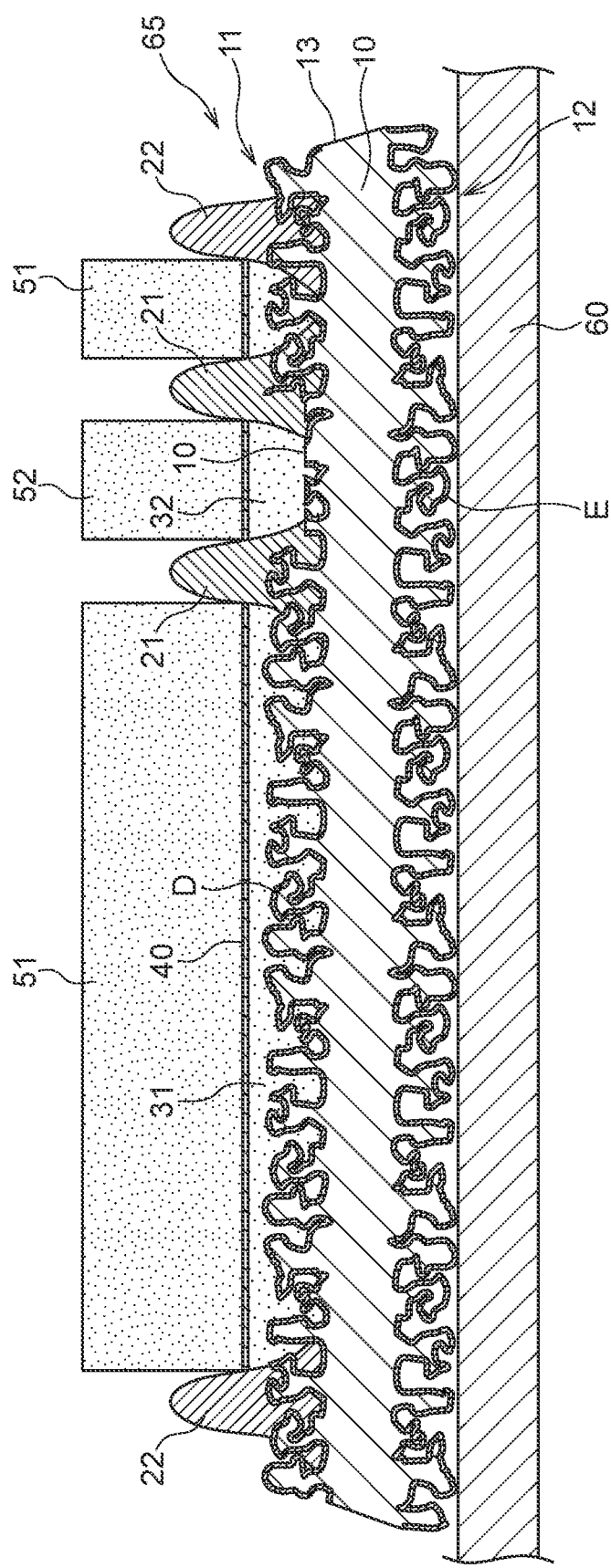
FIG. 25A is a process view for explaining the manufacturing method for the thin film capacitor 1.
Figure 25B:
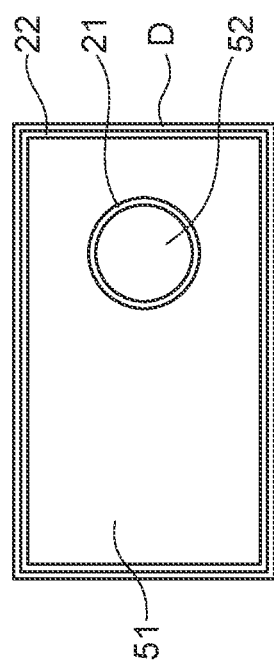
FIG. 25B is a schematic plan view of FIG. 25A.

In this state, electrolytic plating is performed to form the terminal electrodes 51 and 52 (FIGS. 23A and 23B). Then, after removing the resist 67 by ashing or the like (FIGS. 24A and 24B), the seed layer 40 is removed (FIGS. 25A and 25B). After that, the insulating film 14 is formed on the side surface 13 of the metal foil 10 (FIG. 26), and the base material 60 for conveyance is removed by peeling or etching (FIG. 27), whereby the thin film capacitor 1 illustrated in FIGS. 1A and 1B is completed. The insulating film 14 can be formed by oxidizing the side surface 13 of the metal foil 10 by an ashing process for removing the resist 67 or a heat treatment process. The terminal electrodes 51 and 52 may each be formed in plural numbers, and at least one pair of the terminal electrodes 51 and 52 will suffice.

Figure 28:
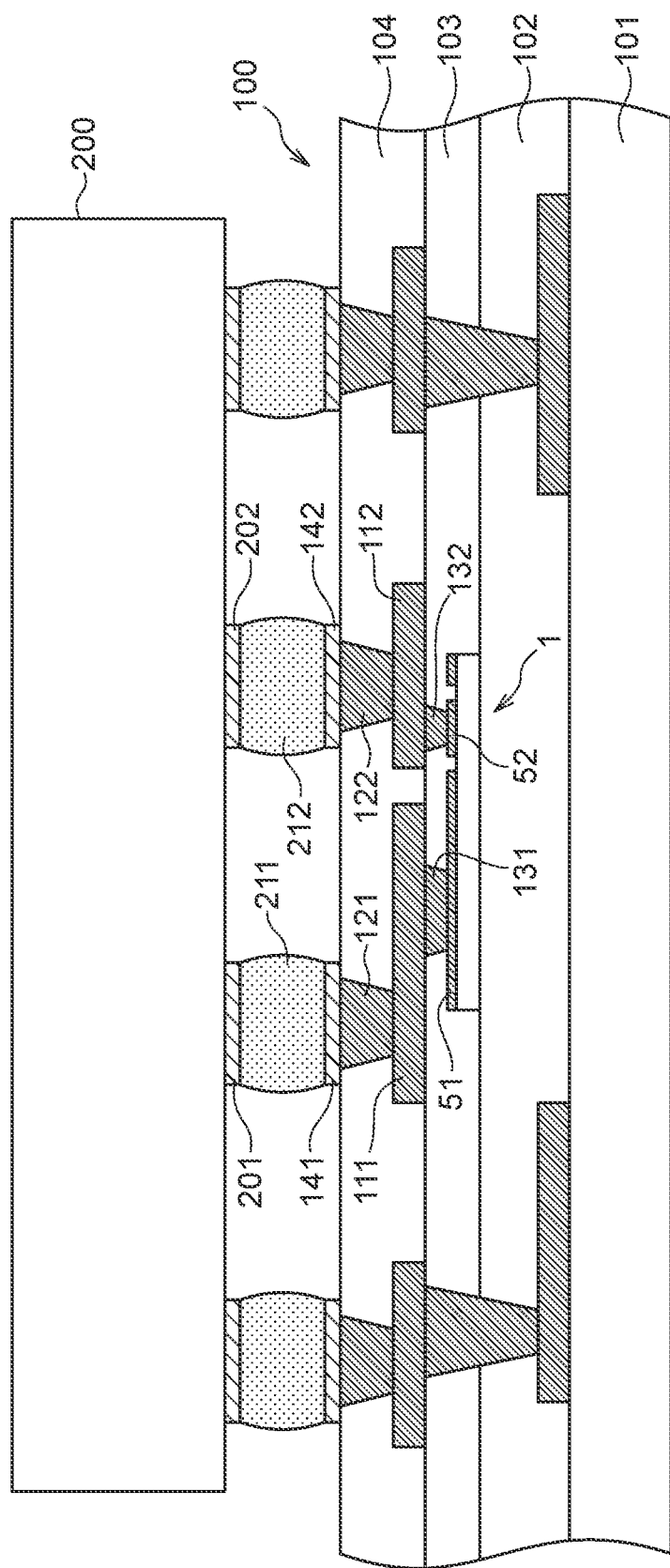
FIG. 28 is a schematic cross-sectional view illustrating an electronic circuit substrate having a configuration in which the thin film capacitor 1 is embedded in a multilayer substrate 100.
Figure 29:
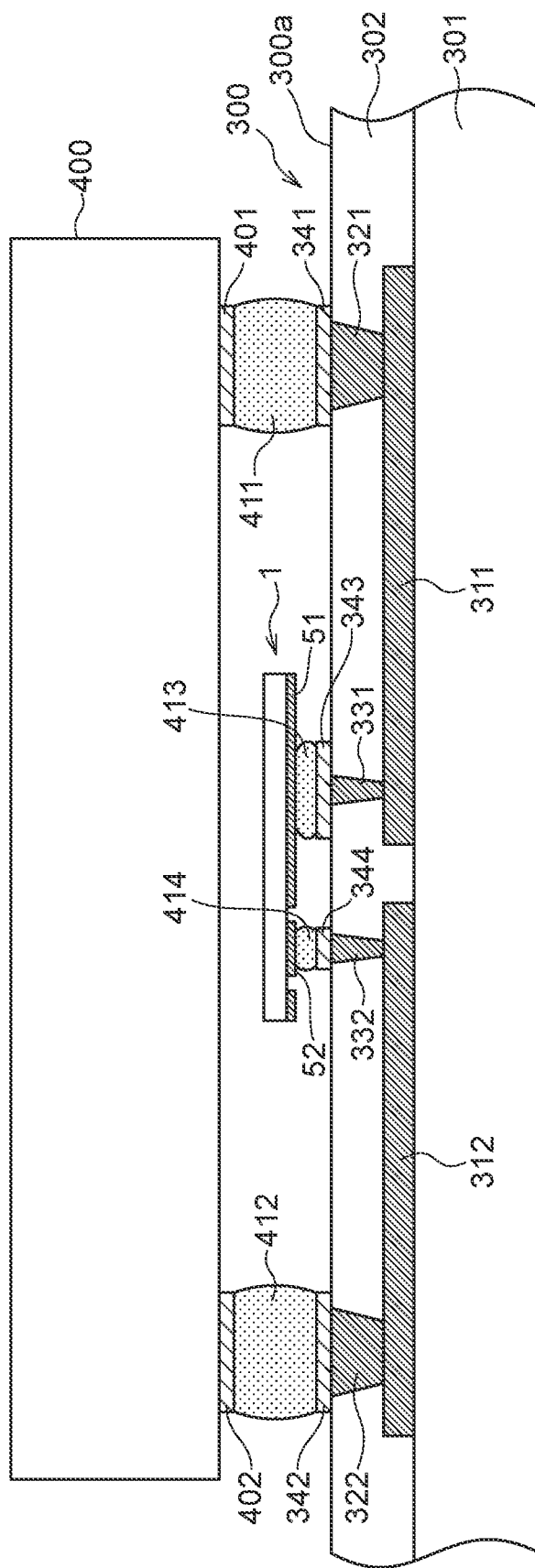
FIG. 29 is a schematic cross-sectional view illustrating an electronic circuit substrate having a configuration in which the thin film capacitor 1 is mounted on the surface of a multilayer substrate 300.

The thin film capacitor 1 according to the present embodiment may be embedded in a multilayer substrate 100 as illustrated in FIG. 28 or may be mounted on the surface of a multilayer substrate 300 as illustrated in FIG. 29.

An electric circuit substrate illustrated in FIG. 28 has a configuration in which a semiconductor IC 200 is mounted on the multilayer substrate 100. The multilayer substrate 100 includes a plurality of insulating layers including insulating layers 101 to 104 and a plurality of wiring patterns including wiring patterns 111 and 112. The number of insulating layers is not particularly limited. In the example illustrated in FIG. 28, the thin film capacitor 1 is embedded between the insulating layers 102 and 103. There are provided on the surface of the multilayer substrate 100 a plurality of land patterns including land patterns 141 and 142. The semiconductor IC 200 has a plurality of pad electrodes including pad electrodes 201 and 202. For example, one of the pad electrodes 201 and 202 is a power supply terminal, and the other one thereof is a ground terminal. The pad electrode 201 and land pattern 141 are connected to each other through a solder 211, and the pad electrode 202 and the land pattern 142 are connected to each other through a solder 212. The land pattern 141 is connected to the terminal electrode 51 of the thin film capacitor 1 through a via conductor 121, the wiring pattern 111, and a via conductor 131. The land pattern 142 is connected to the terminal electrode 52 of the thin film capacitor 1 through a via conductor 122, the wiring pattern 112, and a via conductor 132. With this configuration, the thin film capacitor 1 functions as a decoupling capacitor for the semiconductor IC 200.

An electric circuit substrate illustrated in FIG. 29 has a configuration in which a semiconductor IC 400 is mounted on the multilayer substrate 300. The multilayer substrate 300 includes a plurality of insulating layers including insulating layers 301 and 302 and a plurality of wiring patterns including wiring patterns 311 and 312. The number of insulating layers is not particularly limited. In the example illustrated in FIG. 29, the thin film capacitor 1 is surface-mounted on a surface 300a of the multilayer substrate 300. There are provided on the surface 300a of the multilayer substrate 300 a plurality of land patterns including land patterns 341 to 344. The semiconductor IC 400 has a plurality of pad electrodes including pad electrodes 401 and 402. For example, one of the pad electrodes 401 and 402 is a power supply terminal, and the other one thereof is a ground terminal. The pad electrode 401 and the land pattern 341 are connected to each other through a solder 411, and the pad electrode 402 and the land pattern 342 are connected to each other through a solder 412. The land pattern 341 is connected to the terminal electrode 51 of the thin film capacitor 1 through a via conductor 321, the wiring pattern 311, a via conductor 331, and a solder 413. The land pattern 342 is connected to the terminal electrode 52 of the thin film capacitor 1 through a via conductor 322, the wiring pattern 312, the land pattern 344, and a via conductor 332, and a solder 414. With this configuration, the thin film capacitor 1 functions as a decoupling capacitor for the semiconductor IC 400.

While the preferred embodiment of the present invention has been described, the present invention is not limited to the above embodiment, and various modifications may be made within the scope of the present invention, and all such modifications are included in the present invention.

EXAMPLES

A plurality of thin film capacitors having the same configuration as the thin film capacitor 1 illustrated in FIG. 1 were prepared with the film thickness and material of the dielectric film E covering the lower surface 12 of the metal foil 10 and the surface roughness of the upper and lower surfaces 11 and 12 of the metal foil 10 were varied from one sample to another. The planar size of each sample was set to 1.0 mm×0.5 mm. The material of the dielectric film D covering the upper surface 11 of the metal foil 10 was $Al_2O_3$, and the film thickness thereof was fixed to 5 nm. Each sample of the thin film capacitor was mounted in an evaluation multilayer substrate, and the occurrence probability of a mounting failure rate was evaluated. The mounting failure includes a connection failure, cracks, a short-circuit failure, a pickup failure which are caused due to warpage of the thin film capacitor. The results are shown in FIG. 30.

As illustrated in FIG. 30, the occurrence probability of the mounting failure was 42% in a sample B1 having no dielectric film E, while the occurrence probability of the mounting failure was 32% or less in samples A1 to A18 having the dielectric film E. The occurrence probability of the mounting failure was lower in samples A2 to A18 in which the thermal expansion coefficient of the dielectric film E was 10 ppm/° C. or less and was 28% or less. Further, the occurrence probability of the mounting failure was even lower in samples A6 to A15 in which Rq2/Rq1 was 1.8 or more, where Rq1 is the surface roughness Rq (root mean square height) of the upper surface 11 of the metal foil 10, and Rq2 is the surface roughness Rq (root mean square height) of the lower surface 12 of the metal foil 10, and was 18% or less. In particular, in samples A13 to A15 in which the film thickness of the dielectric film E was 9 nm to 11 nm, the occurrence probability of the short-circuit failure was 4% or less. Further, in samples A16 to A18, in which the dielectric film E was a multilayer film formed by laminating different dielectric materials, the occurrence probability of the short-circuit failure was 12% to 19% even when Rq2>Rq1.

REFERENCE SINGS LIST

1: Thin film capacitor
10: Metal foil
10a: Non-porous layer
11: Upper surface of metal foil
11a: Porous layer
12: Lower surface of metal foil
12a: Porous layer
13: Side surface of metal foil
14: Insulating film
21, 22: Insulating member
31, 32: Conductive member
40: Seed layer
51, 52: Terminal electrode
60: Base material for conveyance
61, 64, 67: Resist
62, 65, 68, 69: Opening
100, 300: Multilayer substrate
101 to 104, 301, 302: Insulating layer
111, 112, 311, 312: Wiring pattern
121, 122, 131, 132, 321, 322, 331, 332: Via conductor
141, 142, 341 to 344: Land pattern
200, 400: Semiconductor IC
201, 202, 401, 402: Pad electrode
211, 212, 411 to 414: Solder
300a: Surface of multilayer substrate
D, E: Dielectric film

What is claimed is:

1. A thin film capacitor comprising:
a metal foil having a roughened first porous layer positioned on one main surface side, a roughened second porous layer positioned on other main surface side, and a non-roughened non-porous layer positioned between the first and second porous layers;
a first dielectric film covering the one main surface of the metal foil and having an opening through which the metal foil is partly exposed;
a second dielectric film covering the other main surface of the metal foil and made of a dielectric material having a thermal expansion coefficient smaller than that of the metal foil;
a first electrode layer contacting the metal foil through the opening; and
a second electrode layer contacting the first dielectric film without contacting the metal foil,
wherein the second dielectric film is thicker than the first dielectric film.

2. The thin film capacitor as claimed in claim 1, wherein the second dielectric film is made of the same dielectric material as the first dielectric film.

3. The thin film capacitor as claimed in claim 1, wherein the second dielectric film is made of a dielectric material different from that of the first dielectric film.

4. The thin film capacitor as claimed in claim 1, wherein the second dielectric film is a multilayer film having a plurality of laminated dielectric materials.

5. The thin film capacitor as claimed in claim 1, wherein the second dielectric film has a film thickness of 9 nm or more.

6. The thin film capacitor as claimed in claim 1, wherein the second dielectric film has a thermal expansion coefficient of 10 ppm/° C. or less.

7. The thin film capacitor as claimed in claim 1, wherein the other main surface of the metal foil has a surface roughness higher than that of the one main surface of the metal foil.

8. The thin film capacitor as claimed in claim 7, wherein, assuming that a surface roughness Rq (root mean square height) of the one main surface of the metal foil is Rq1, and a surface roughness Rq (root mean square height) of the other main surface of the metal foil is Rq2, Rq2/Rq1 is 1.8 or more.

9. The thin film capacitor as claimed in claim 1,
wherein the first and second electrode layers are separated from each other by an annular slit,
wherein the first electrode layer is provided in a first area surrounded by the slit, and
wherein the second electrode layer is provided in a second area positioned outside the slit.

10. The thin film capacitor as claimed in claim 9, further comprising an insulating member provided inside the slit and positioned between the first and second electrode layers.

11. The thin film capacitor as claimed in claim 1, wherein the second electrode layer includes a first conductive member contacting the first dielectric film and made of a conductive polymer material and a second conductive member contacting the first conductive member and made of a metal material.

12. The thin film capacitor as claimed in claim 11, wherein the first electrode layer includes a third conductive member contacting the metal foil and made of a conductive polymer material and a fourth conductive member contacting the third conductive member and made of a metal material.

13. The thin film capacitor as claimed in claim 11, wherein the first electrode layer includes a fourth conductive member contacting the metal foil and made of a metal material.

14. An electronic circuit substrate comprising:
a substrate having a wiring pattern;
a semiconductor IC provided on the substrate; and
the thin film capacitor as claimed in claim 1 provided in the substrate,
wherein the first and second electrode layers of the thin film capacitor are connected to the semiconductor IC through the wiring pattern.

15. A thin film capacitor comprising:
a metal foil having a roughened first porous layer positioned on one main surface side, a roughened second porous layer positioned on other main surface side, and a non-roughened non-porous layer positioned between the first and second porous layers;
a first dielectric film covering the one main surface of the metal foil and having an opening through which the metal foil is partly exposed;
a second dielectric film covering the other main surface of the metal foil and made of a dielectric material having a thermal expansion coefficient smaller than that of the metal foil;
a first electrode layer contacting the metal foil through the opening; and
a second electrode layer contacting the first dielectric film without contacting the metal foil, and
wherein the second dielectric film is made of a dielectric material different from that of the first dielectric film.

16. A thin film capacitor comprising:
a metal foil having a roughened first porous layer positioned on one main surface side, a roughened second porous layer positioned on other main surface side, and a non-roughened non-porous layer positioned between the first and second porous layers;
a first dielectric film covering the one main surface of the metal foil and having an opening through which the metal foil is partly exposed;
a second dielectric film covering the other main surface of the metal foil and made of a dielectric material having a thermal expansion coefficient smaller than that of the metal foil;
a first electrode layer contacting the metal foil through the opening; and
a second electrode layer contacting the first dielectric film without contacting the metal foil, and
wherein the second dielectric film is a multilayer film having a plurality of laminated dielectric materials.

* * * * *